(12) United States Patent
Iversen et al.

(10) Patent No.: US 11,664,008 B2
(45) Date of Patent: May 30, 2023

(54) ACTIVE DISPLAY WITH REDUCED SCREEN-DOOR EFFECT

(71) Applicant: IMAX Theatres International Limited, Dublin (IE)

(72) Inventors: Steen Svendstorp Iversen, Dublin (IE); Denis Gilles Tremblay, Cambridge (CA)

(73) Assignee: IMAX Theatres International Limited, Dublin (IE)

( * ) Notice: Subject to any disclaimer, the term of this patent is extended or adjusted under 35 U.S.C. 154(b) by 560 days.

(21) Appl. No.: 16/615,144

(22) PCT Filed: Jun. 19, 2018

(86) PCT No.: PCT/EP2018/066319
§ 371 (c)(1),
(2) Date: Nov. 20, 2019

(87) PCT Pub. No.: WO2018/234344
PCT Pub. Date: Dec. 27, 2018

(65) Prior Publication Data
US 2020/0160829 A1    May 21, 2020

Related U.S. Application Data

(60) Provisional application No. 62/644,801, filed on Mar. 19, 2018, provisional application No. 62/522,436, filed on Jun. 20, 2017.

(51) Int. Cl.
*G10K 11/18* (2006.01)
*G02B 30/25* (2020.01)
(Continued)

(52) U.S. Cl.
CPC ............ *G10K 11/18* (2013.01); *G02B 3/0056* (2013.01); *G02B 5/003* (2013.01); *G02B 5/0278* (2013.01); *G02B 30/25* (2020.01); *H01L 25/0753* (2013.01)

(58) Field of Classification Search
CPC ........................ G09G 2300/026; G06F 3/1446
See application file for complete search history.

(56) References Cited

U.S. PATENT DOCUMENTS 1,945,710 A    2/1934 Smoot
2,448,560 A    9/1948 Walker
(Continued)

FOREIGN PATENT DOCUMENTS

CN    1512820    7/2004
CN    101069454    11/2007
(Continued)

OTHER PUBLICATIONS

CN. Application No. 201880040791.7, Office Action, dated Jun. 30, 2021, 18 pages.
(Continued)

*Primary Examiner* — Andrew J Coughlin
(74) *Attorney, Agent, or Firm* — Kilpatrick Townsend & Stockton LLP

(57) ABSTRACT

An active display can be used in a theatre with reduced screen-door effect. For example, the active display can have a structure, such as a diffuser structure, or a diffuser and mask structure, that can have, or appear to have, transmissive areas and opaque areas to reduce the audience from detecting gaps or other non-light sources in the active display. The active display may additionally or alternatively have audio ports to allow sound to pass through the active display and appear to the audience as if the sound is coming from the active display.

43 Claims, 15 Drawing Sheets

(51) Int. Cl.
*G02B 3/00* (2006.01)
*G02B 5/00* (2006.01)
*G02B 5/02* (2006.01)
*H01L 25/075* (2006.01)

(56) References Cited

U.S. PATENT DOCUMENTS

| | | | |
|---|---|---|---|
| 2,974,566 A | 3/1961 | Hurley | |
| 5,366,761 A | 11/1994 | Chin et al. | |
| 6,513,622 B1* | 2/2003 | Gelow | H04R 1/345 |
| | | | 381/345 |
| 6,999,665 B2 | 2/2006 | Veligdan | |
| 7,862,206 B2 | 1/2011 | Chen et al. | |
| 8,049,747 B2 | 11/2011 | Arneson et al. | |
| 8,300,304 B2 | 10/2012 | Gally et al. | |
| 8,542,270 B2 | 9/2013 | Nelson | |
| 8,944,609 B2 | 2/2015 | Fox et al. | |
| 9,030,386 B2 | 5/2015 | Park | |
| 9,069,121 B2 | 6/2015 | Ligorano et al. | |
| 9,558,720 B2 | 1/2017 | Jepsen et al. | |
| 10,638,218 B2 | 4/2020 | Slack | |
| 10,807,016 B2 | 10/2020 | Tremblay et al. | |
| 2005/0078104 A1 | 4/2005 | Matthies et al. | |
| 2006/0153391 A1 | 7/2006 | Hooley et al. | |
| 2006/0170614 A1 | 8/2006 | Tzong et al. | |
| 2006/0262273 A1 | 11/2006 | Read et al. | |
| 2007/0035706 A1 | 2/2007 | Margulis | |
| 2008/0118178 A1 | 5/2008 | Way et al. | |
| 2010/0053450 A1 | 3/2010 | Hanamura et al. | |
| 2010/0073468 A1* | 3/2010 | Kutner | G03B 37/00 |
| | | | 726/26 |
| 2013/0093646 A1 | 4/2013 | Curtis et al. | |
| 2013/0335716 A1 | 12/2013 | Shields | |
| 2014/0071026 A1 | 3/2014 | Hatashita et al. | |
| 2014/0168786 A1 | 6/2014 | Lee | |
| 2014/0177062 A1 | 6/2014 | Lee et al. | |
| 2014/0233747 A1 | 8/2014 | Fox | |
| 2014/0235362 A1 | 8/2014 | Fox et al. | |
| 2015/0208151 A1 | 7/2015 | Fox | |
| 2016/0086582 A1 | 3/2016 | Hu | |
| 2016/0163018 A1 | 6/2016 | Wang et al. | |
| 2016/0366379 A1 | 12/2016 | Hickl | |
| 2017/0116895 A1 | 4/2017 | Declerck | |
| 2018/0006011 A1 | 1/2018 | Ninan et al. | |
| 2018/0190747 A1 | 7/2018 | Son et al. | |
| 2019/0043940 A1 | 2/2019 | Lee et al. | |
| 2020/0068295 A1 | 2/2020 | Congard | |
| 2020/0160829 A1 | 5/2020 | Iversen et al. | |
| 2020/0193943 A1 | 6/2020 | Iversen et al. | |
| 2021/0001242 A1 | 1/2021 | Tremblay et al. | |
| 2021/0134212 A1 | 5/2021 | Kim | |

FOREIGN PATENT DOCUMENTS

| | | |
|---|---|---|
| CN | 101273660 | 9/2008 |
| CN | 201836731 U | 5/2011 |
| CN | 202548524 | 11/2012 |
| CN | 104067150 | 9/2014 |
| CN | 204406978 U | 6/2015 |
| CN | 204925601 U | 12/2015 |
| CN | 105243978 | 1/2016 |
| CN | 105247150 | 1/2016 |
| CN | 205278981 U | 6/2016 |
| EP | 1435755 | 7/2004 |
| EP | 1883920 | 2/2008 |
| EP | 3111639 | 1/2017 |
| EP | 3155606 | 4/2017 |
| JP | 06214508 | 8/1994 |
| JP | 06327090 | 11/1994 |
| JP | 2001133888 | 5/2001 |
| JP | 2003177465 | 6/2003 |
| JP | 2005117267 | 4/2005 |
| JP | 2005269402 | 9/2005 |
| JP | 2008542994 | 11/2008 |
| JP | 2009528086 | 8/2009 |
| JP | 2012204979 | 10/2012 |
| JP | 2012529073 A | 11/2012 |
| KR | 910009794 | 11/1991 |
| KR | 20070086826 | 8/2007 |
| KR | 20110032180 | 3/2011 |
| KR | 101305252 B1 | 9/2013 |
| WO | 2007087376 | 8/2007 |
| WO | 2008093721 | 8/2008 |
| WO | 2011135283 | 11/2011 |
| WO | 2016115040 | 7/2016 |
| WO | 2018065955 | 4/2018 |

OTHER PUBLICATIONS

International Patent Application No. PCT/EP2018/066319, International Search Report and Written Opinion dated Nov. 8, 2018, 14 pages.
Application No. CN 201880040791.7, Office Action, dated Mar. 2, 2022, (English Translation 4 pages Chinese Translation 2 pages).
Application No. CN201880040791.7, Notice of Decision to Grant, dated Dec. 5, 2022, 4 pages.
Application No. CN201880040791.7, Office Action, dated Sep. 5, 2022, 11 pages.

* cited by examiner

ACTIVE DISPLAY WITH REDUCED SCREEN-DOOR EFFECT

CROSS-REFERENCE TO RELATED APPLICATIONS

This claims the benefit of priority to U.S. Provisional Patent Application No. 62/522,436, titled "LED Display with Audio Ports" and filed Jun. 20, 2017, and to U.S. Provisional Patent Application No. 62/644,801, titled "Diffuser with Mask for Reducing Visible Pixel Gaps in an Active Visual Display" and filed Mar. 19, 2018, the entirety of each of which is incorporated herein by reference.

TECHNICAL FIELD

This disclosure relates to active displays for visual presentations. Some examples relate to active displays for theatre presentations of movies and other visual media.

BACKGROUND

Large LED displays can be used for advertising applications such as billboards or presenting text, images, video, etc. Recently, LED displays have been used in cinemas, presenting potential advantages over light projection systems in image-quality parameters such as brightness, contrast, and clarity.

But an LED display does not allow pressure waves providing audio to pass through the display, unlike a cinema projection screen that is perforated to allow audio from loudspeakers located behind the screen to pass therethrough to give audiences an experience of sound coming from the center of the image or from objects in different locations in the image. Creating ports in the display can result in the audience experiencing a degraded visual image—for example, the audio ports may result in visible artifacts such as the screen-door effect where the audience perceives a display image as if looking through a screen door. Another cause of screen-door effect can include a pixel pitch (i.e., the distance between pixels, relative to the distance of observers) that is too high.

DETAILED DESCRIPTION

Figure 1A:
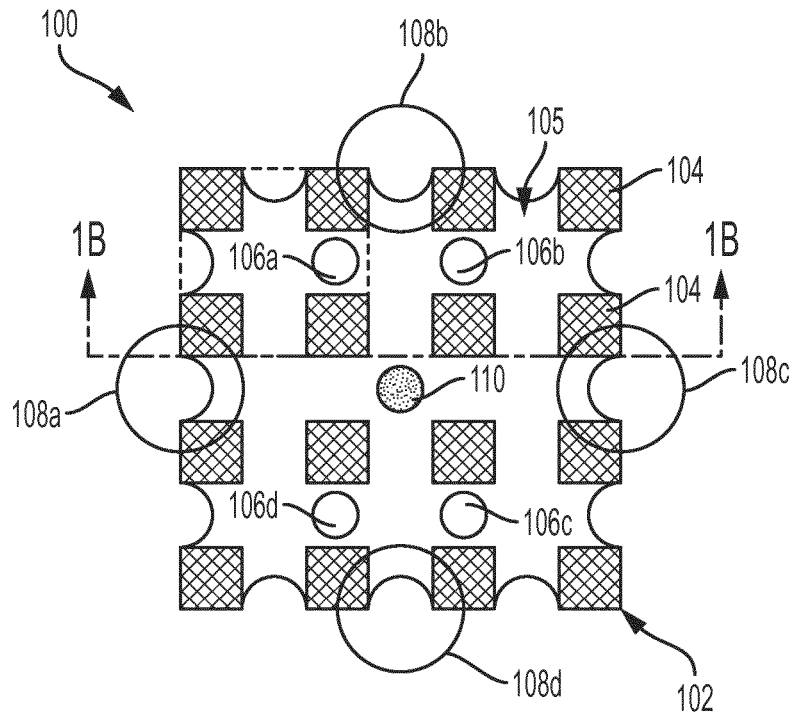
FIG. 1A is a front, schematic view of an LED display with audio ports and alternating areas of opaque areas and transmissive areas according to one example of the present disclosure.

Certain aspects and features of the present disclosure relate to an active display with reduced screen-door effect. The active display, which can have active light-emitting elements rather than solely relying on a projector to project an image onto the display, can have additional structures that can allow light to be outputted in a manner to reduce or eliminate the screen-door effect. Examples of those structures include a diffuser with a mask that has opaque areas and non-opaque areas for allowing light to pass through in a manner to create a visual appearance of the display having more sources of light than the number of active light-emitting elements included in the display.

In some examples, the active display is an LED display with audio ports therethrough and an LED configuration that can allow sound waves from behind the display to pass through the display via the audio ports without significantly degrading the visual quality of image content on the LED display.

An LED display that includes several LED pixel tiles may be used in an immersive cinema where seats may be located close to the screen. For example, a 70-foot-wide display with a 4K resolution may be installed in a cinema where the front row is located ⅓ of the screen width from the display. In such a configuration, audience members in the front rows may be able to resolve the dark gaps, which can be an unpleasant, distracting artifact sometimes referred to as the "screen-door effect," where the audience perceives a display image as if looking through a screen door. In one example, the LED configuration includes a structure positioned between an audience position and the LEDs. The structure includes one or more areas that diffuse light from the LEDs and one or more areas that are opaque and block light from the LEDs, to control the distribution of light from the LEDs to compensate for the presence of the audio ports and diminish the visual screen-door effect that an audio port pattern may otherwise have in being visually apparent.

In other examples, the LED configuration includes certain LEDs arranged with a spatial offset from other LEDs, a spatial offset that is non-uniform, a random positioning of the audio ports over the display area, or increasing the audio port opening at the back of the display relative to the audio port opening at the audience side of the display to better facilitate audio waves to pass through the display without significantly degrading a visual experience. A pixel of the active display can be formed by one or more active light-emitting elements. For example, a 3D pixel may be formed by two light-emitting elements—one for each eye of a viewer. Two or more non-opaque (or transparent) portions of the mask for the diffuser can correspond to each pixel.

In some examples, the diffuser can include a structure, such as a diffuser mask, that causes portions of the diffuser to be opaque and other portions to be not opaque such that there is more than one non-opaque portion per active light element that is behind the diffuser. In effect, this can create the appearance of more pixels in a display and reduce or eliminate the screen-door effect that may otherwise be experienced by audience members. For example, light from an active light element can exit the diffuser at the two or more non-opaque portions toward the audience members such that it appears there to be two or more points of light sources. Using certain aspects of the present disclosure can avoid the need to add additional LED pixels to increase the spatial frequency, which is expensive and may require scaling of image content and a decrease in the gap size between pixels.

These illustrative examples are given to introduce the reader to the general subject matter discussed here and are not intended to limit the scope of the disclosed concepts. The following sections describe various additional features and examples with reference to the drawings in which like numerals indicate like elements but, like the illustrative examples, should not be used to limit the present disclosure.

FIG. 1A is a schematic of the front (i.e., audience facing) of part of an LED display 100 with a structure that includes diffusers 102 (also referred to as "diffuser structures") according to one example. Four LEDs 106a-d are shown positioned behind the diffuser structure 102. Each LED can represent one image pixel in a display. Each LED represented in FIG. 1A can be an LED packet which can include several smaller LEDs. For example, the LED 106a can include three color LEDs, such as a red LED, a green LED, and a blue LED. Another LED packet configuration can be two or more white LEDS that have some spatial separation to distribute light more evenly over an area within the diffuser structure. The terms "LEDs" and "LED packets" is used interchangeably herein, unless specified otherwise.

A pin 110 is included to couple the diffuser structure 102 to a substrate, such as a body, that includes the LEDs 106a-d or defines the audio ports 108a-d. Portions of the structure can be absent of material so that audio through the audio ports can pass therethrough toward an audience.

Figure 1B:
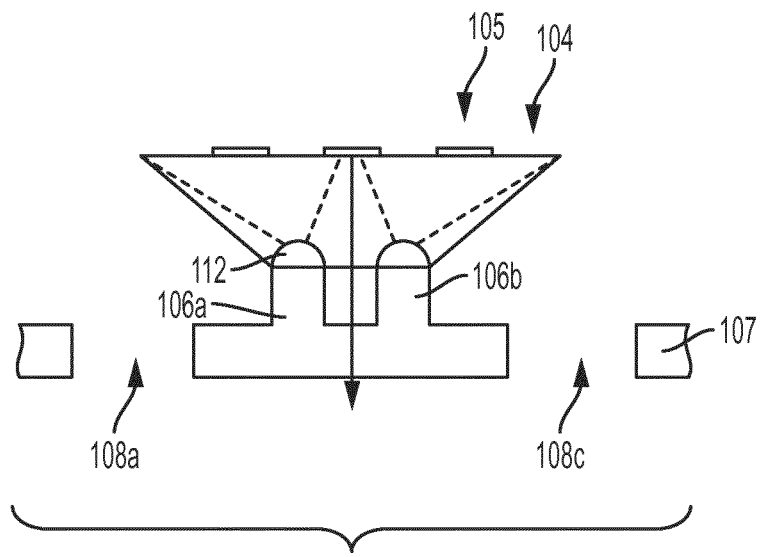
FIG. 1B is a cross-sectional, schematic view of the LED display of FIG. 1A according to one example of the present disclosure.

The body (not shown in FIG. 1A) defines audio ports 108a-d that are also positioned behind the diffuser structure 102. The body (which is body 107 in FIG. 1B) can be a printed circuit board or other substrate or a matrix of material structure to facilitate mounting display components such as the LEDs, LED packets, light diffuser structures, and features to facilitate the transmission of audio waves through the display. FIG. 1B is a side view of the part of the LED display 100 of FIG. 1A. At least one lenslet 112 positioned on top of the LED can direct light from an LED 106a or 106b to at least one transmissive area 104 (also referred to as a non-opaque area) on the surface of the diffuser structure. In some examples, each LED can output light that is directed to more than one transmissive area 104 such that each transmissive area appears to the audience as being a separate source of light. For example, light from one of the LEDs 106a-d can be directed to two or four transmissive areas 104. Other optical structures can be used to direct light from one LED to two or more transmissive areas 104. Examples of other optical structures include waveguides, prisms, and mirrors. A transmissive (or transparent) area 104 can be an area of the diffuser structure that allows light to pass therethrough. Also included are opaque areas 105 between the transmissive areas 104 on the diffuser structure 102 such that the opaque areas 105 and the gap areas (not shown) can visually appear to be similar. The diffuser structure in FIGS. 1A and 1B can cover each of the four LEDs 106a-d depicted.

Any number of opaque areas 105 and transmissive areas 104 can be included. In some examples, each LED is associated with at least two opaque areas 105. And, each LED may be associated with at least two transmissive (or transparent) areas 104. In some examples, each transmissive area 104 has the same horizontal width as the horizontal width of each opaque area 105 between the transmissive areas 104. And each transmissive area 104 may have the same vertical height as the vertical height of each opaque area 105 between the transmissive areas 104.

Figure 2A:
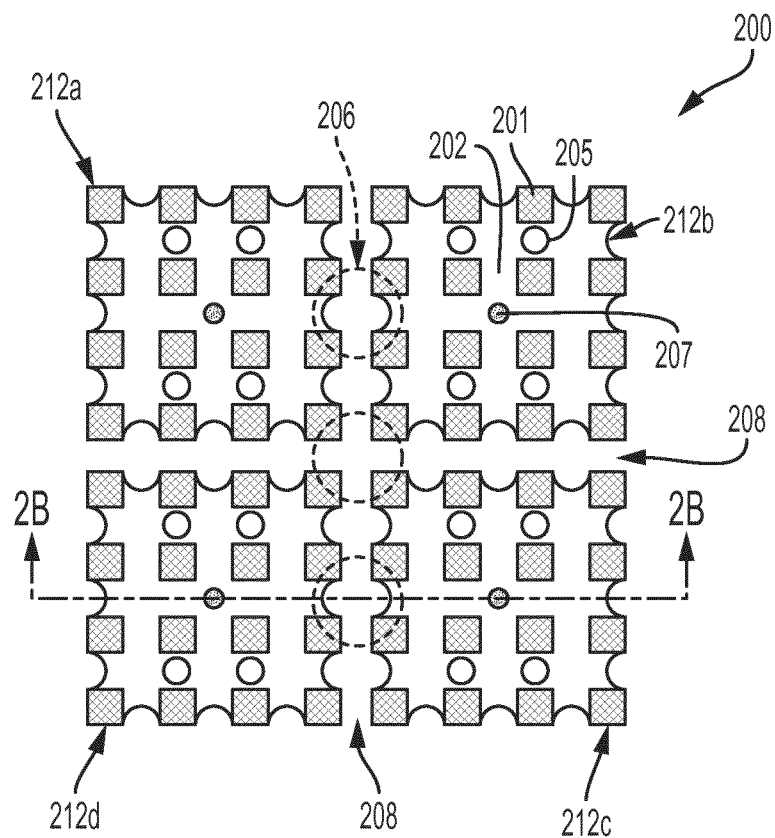
FIG. 2A is a front, schematic view of an LED display with audio ports and alternating areas of opaque areas and transmissive areas according to another example of the present disclosure.

FIG. 2A is a front view of part of an LED display 200 with four light diffuser structures 212a-d. Each diffuser structure has at least one LED 205 and may have four or more LEDs 205. Each LED 205 has an optical structure over it with optically clear material. The diffuser structure can be mounted so that multiple light diffuser structures 212a-d cover the surface area of the LED display 200, with gaps 208 formed between the light diffuser structures. The gaps 208 between diffuser structures 112a-d can align over the audio ports 206. The size of the gaps 208 can depend on the width or height of the diffuser structures 212a-d. In one example, the gaps 208 are ⅕$^{th}$ of the width or height of the diffuser structure. A soldering pin 207 can be included for coupling each of the diffuser structures 212a-d to the body. Audio ports 206 may be circular or elongated. Elongated audio ports may increase the opening area to reduce resistance to audio waves.

The light diffuser structures 212a-d can be relatively small, with the gaps 208 between the light diffuser structures 212a-d so that stress that can be induced into the mount of the diffuser structures 212a-d to the body can be reduced.

The stress can be induced by sound pressure from the audio waves from the audio devices passing through the LED display 200. Also included in the diffuser structures 212a-d in FIG. 2A are opaque areas 202 between the transmissive areas 201 on the structures 212a-d such that the opaque areas 202 and the gaps 208 can visually appear to be similar. The opaque areas 202 on the diffuser structures 212a-d can appear darker or as a black space. The opaque areas 202 can also be dimensionally similar or the same as the area of the gaps 208 between the diffuser structures 212a-d. For example, the gaps 208 can be vertical columns and horizontal rows, and the opaque areas 202 can appear as vertical columns and horizontal rows. The size of the vertical columns and horizontal rows of the gaps 208 can be the same or similar as the vertical columns and horizontal rows of the opaque areas 202. By having gaps 208 between the diffuser structures 212a-d and the opaque areas 202 within the diffuser structures 212a-d visually appear similar, the visual combination can result in an increase in the spatial frequency of the darker or black areas that reduces or eliminates the perception of the screen-door effect of having audio port gaps over the display surface. The gaps 208 between the diffuser structures 212a-d can appear similar to the opaque areas 202 and the space behind the gaps 208 can be darkened with a coating that is similar in color as the opaque areas 202. An example of the coating is one that is matt black in color. The audio ports 206 may be covered with a black liner that is transparent to sound waves, but that absorbs light. The black liner may be a sheet of material placed behind the diffuser structures 212a-d.

Figure 2B:
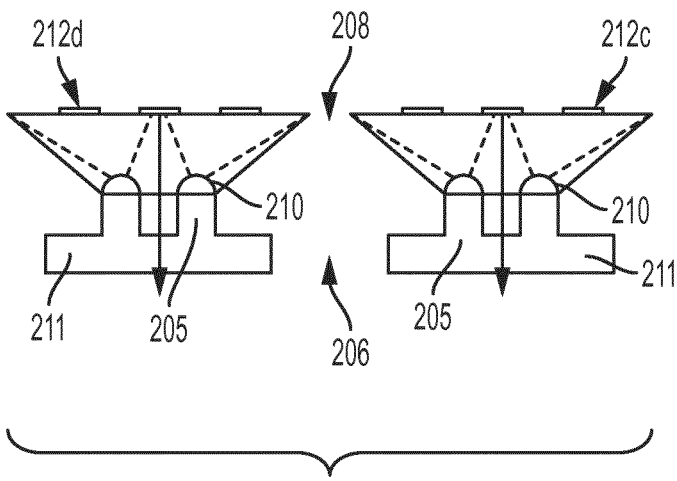
FIG. 2B is a cross-sectional, schematic view of the LED display of FIG. 2A according to one example of the present disclosure.
Figure 3:
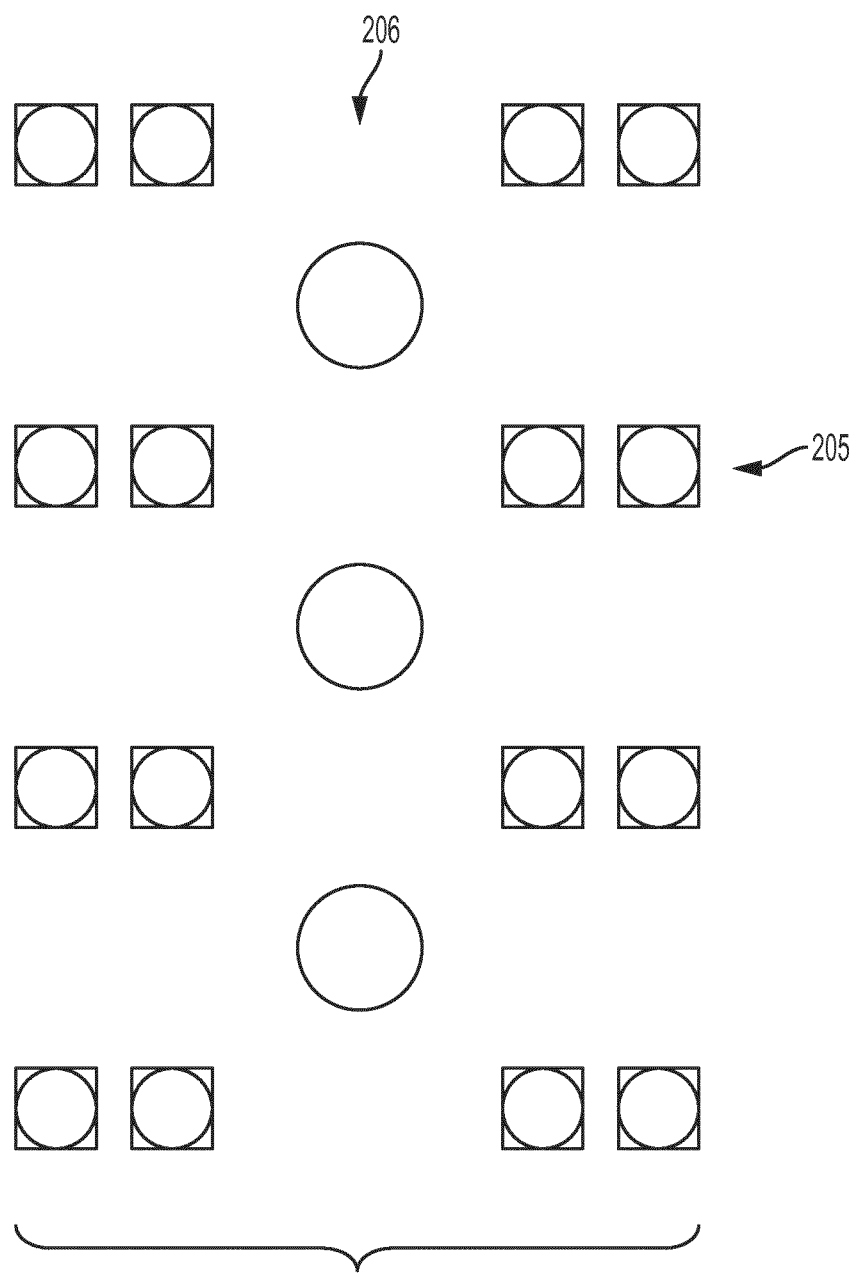
FIG. 3 is a front, schematic view of an LED display without diffuser structures according to one example of the present disclosure.

FIG. 2B is a side view of part of the LED display of FIG. 2A. Two light diffuser structures 212c-d and the gap 208 between the two light diffuser structures 212c-d are shown. The LEDs 205 are coupled to a body that is a printed circuit board (PCB) 211. The lenslet 210 can offset the position of a centroid of emitted light from LEDs 205. The centroid may be offset so that the centroid is closer to an audio port 206 to result in an even distribution of brightness centroids over the display surface, while allowing for large audio ports 206. FIG. 3 depicts an example of LEDs 205 and audio ports 206 to illustrate the relative position of one example that may be positioned under the light diffuser structures 212a-d in FIGS. 2A and 2B.

Referring again to FIGS. 2A and 2B, the lenslets 210 or other optical structures can shape the light beams from the LEDs 205 so that the light beams can be projected to a surface or pass through the optical clear material and reach the surface (e.g., a surface on a diffuser structure or an alternative surface). The surface may be treated, such as being embossed to be a transmissive diffuser to light. The surface can preserve polarization of polarized light. The optical structures can allow each LED 205 to illuminate essentially a "quadrant" of a diffuser structure, i.e., a square of ¼th the area of the diffuser structure in a corner of the diffuser structure. The light diffuser structures 212a-d can leave as much open area, or gaps 208, between them as possible while still allowing the quadrant to be illuminated by the LEDs 205. The open area of the gaps 208 can help reduce stress in the mount of the diffuser structures 212a-d caused by the audio waves passing through the display. In addition, the open space between the structures 212a-d and the body can include additional structures, barriers or materials to reduce the influence of the audio waves on the diffuser structures 212a-d and improve quality of audio transmission through the display. For example, the open space between the diffuser structures 212a-d and the body can be configured differently, such as including an additional partition between audio ports 206. Additionally, audio-diffusing structures (not shown) may be introduced in the space between the light diffuser structures 212a-d and the PCB 211. In some examples, the LEDs 205 may not be distributed evenly over the PCB 211, but rather in rows with alternating smaller and greater distance between audio ports 206, and the lenses or optical structures can divert the emitted light from the LEDs 205 to help illuminate each quadrant more uniformly.

The light diffuser structures 212a-d can include a diffuser mask that is the opaque areas 202 and the transmissive areas 201 in which opaque masks may be printed or painted on the top surface of the diffuser structures 212a-d, allowing light from defined transmissive areas 201 of the diffuser structures 212a-d to be emitted towards the observers. For example, there may be four transmissive areas 201 that are square-shaped in each quadrant, separated by opaque areas 202 in FIG. 2A. The opaque areas 202 can form vertical columns and horizontal rows where the width of each row and column can be the same width as the vertical and horizontal gaps 208 between light diffuser structures 212a-d. This mask may effectively create a pattern of four separate light emitting areas in one quadrant for each LED. This divided light emitting surface of FIG. 2A can result in a viewer not being able to distinguish a gap 208 between the structures from the opaque mask pattern on the diffuser structures 212a-d. The smaller light-emitting areas can be evenly distributed to increase the spatial frequency of the emitted light by 100% or more to eliminate any experience of a screen-door effect of the gaps 208 between diffuser structures 212a-d, even for observers as close to the display as in the front rows in a theatre. The masking can effectively reduce the ability of an audience to detect gaps 208 in which audio ports 206 are positioned and at the same time create, in effect, more (but smaller) light diffusing surfaces for each image pixel. That is, the LED display can appear as if it includes more LEDs than it actually does because the masking creates the visual effect of more sources of light.

Gaps 208 between the diffuser structures 212a-d can be increased by having some material removed from the opaque areas 202 between the transmissive areas 201. For example, shapes essentially equal to sections of a circular disc may be removed, which may further increase the opening of the gaps 208 for improved audio transmission. Further, removing material may provide less uniformly shaped gaps 208, which may further improve audio transmission characteristics, for example by reducing acoustical attenuation effects. Additionally, material may be added to provide further a less uniformly shaped gap.

And the space between the PCB 211 and the front of the light diffuser structures 212a-d can be open to the sides and may further include audio diffusers to reduce resonance and enhance transmission of audio.

Some examples of the present disclosure can allow large audio ports to be used in a PCB, relative to the pixel pitch of the display. Some examples can provide a large volume between the audio ports in the PCB and the gaps between light diffuser structures, which may be filled with structures designed to manage the audio transmission. A degree of freedom in the shape of the gaps can be provided without affecting the perceived image, allowing some freedom in the design of the gaps to manage the audio transmission.

The light diffuser structures 212a-d may be mounted by gluing them onto the LEDs 205. Alternatively, they may have a small, metal soldering pin 207 in the middle, for through-hole mounting and soldering, which may be automated. In other examples, the pin may include a snap-lock, for example having a longitudinal slit through it enabling it to be squeezed smaller as it is pressed through the hole in the printed circuit board, and have small barbs holding it in place once through the hole. The snap lock pin may be mounted on a part of the diffuser structure that is designed to exercise a spring action to the pin, so barbs on the pin can be pressed through the hole in the printed circuit board and the spring action then holds the barbs pressed against the backside of the printed circuit board to retain the diffuser structure tightly in place. Other snap-lock and mounting means may also be used. The diffuser structure can be retained in the correct orientation by, for example, a thin cross structure that can be positioned between the LED packets to assist in aligning the light diffuser structure to the body. The cross may rest against the PCB and provide a contra hold for the through-hole soldering pin or snap lock. Alternative or additionally, thin pins at the edges of the light diffuser structures can provide the contra hold. Alternatively, the light diffuser structures may rest against the LEDs for contra hold.

The light diffuser structures 212a-d may be made from poly(methyl methacrylate) (PMMA) and may be injection-molded or 3D printed. The lenslets 210 or optical structures may be an integral part of the molded design or fabricated separately by other techniques, and mounted to the light diffuser structures 212a-d, for example by using an adhesive. The diffusing pattern on the top of the light diffuser structures 212a-d may be fabricated as part of the injection molding or it may be embossed after the diffuser structure is molded. The masks may be printed onto the light diffuser structures 212a-d or it may be printed on a film sheet that is glued onto the light diffuser structures 212a-d, or it may for example be spray painted using a paint mask fitting over a section of the display for example a pixel tile. The pixel tile can be a larger segment of area of the display. The sides of the light diffuser structures 212a-d may be absorbing or deflecting light so that light from one diffuser structure does not enter the neighboring diffuser structure or prevents the possibility of light from the sides of the lenslet 210 structure from being seen by a viewer through the gap 208 to experience light that is different from the light that is emitted by the diffuser.

Figure 22:
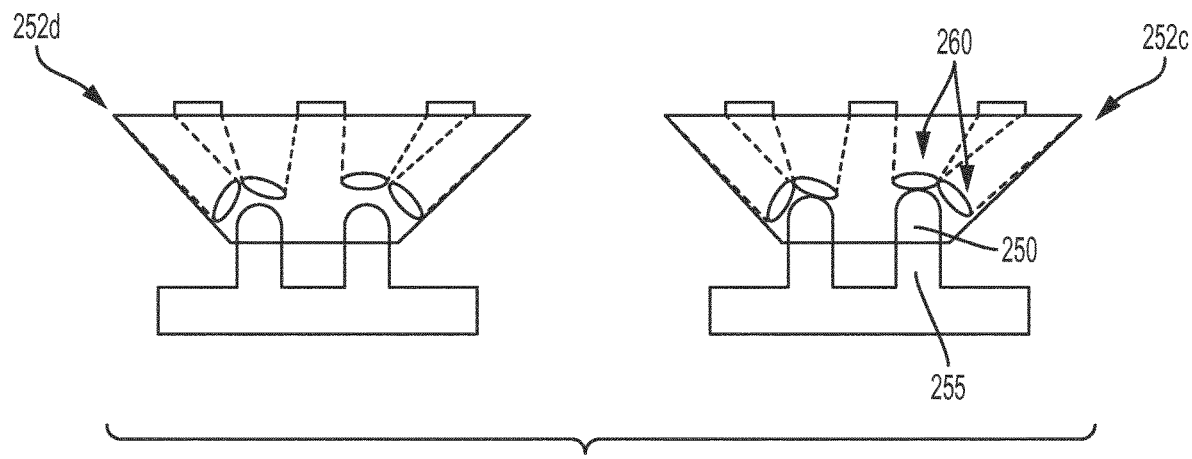
FIG. 22 is a side view of part of an active display according to one example of the present disclosure.

In another example, light diffuser structures can have a surface facing the audience that is transmissive, and the light from LEDs behind the light diffuser structures can be focused on portions of the light diffuser structures where the transmissive areas would have been if the diffuser surface had a mask. For example, a lens on an LED can have two or four lenslets such that each lenslet focuses a portion of the light from the LED onto one of the transmissive areas on a diffuser structure. In other examples, a separate optical structure of lenslets can be positioned between the lens and the diffuser structure, or within the diffuser structure. The separate optical structure may be a fly's eye-type optical element or be multiple lenses positioned side-by-side and in front of the LED. FIG. 22 is a side view of part of an active display according to one example. The part of the active display includes two diffuser structures 252c-d. Each includes LEDs 255 and lenses 250. Each also includes an optical structure that is a side-by-side lenslet 260, which can focus a portion of light from the LEDs 255 onto the transmissive areas. The spaces between the areas, which are intended to be opaque, do not receive light from the LEDs behind the light diffuser structure, and can remain dark. The gaps between the light diffuser structures can have a similar appearance as the portions of the light diffuser structures that do not receive light from the LEDs behind the light diffuser structure.

Figure 4:
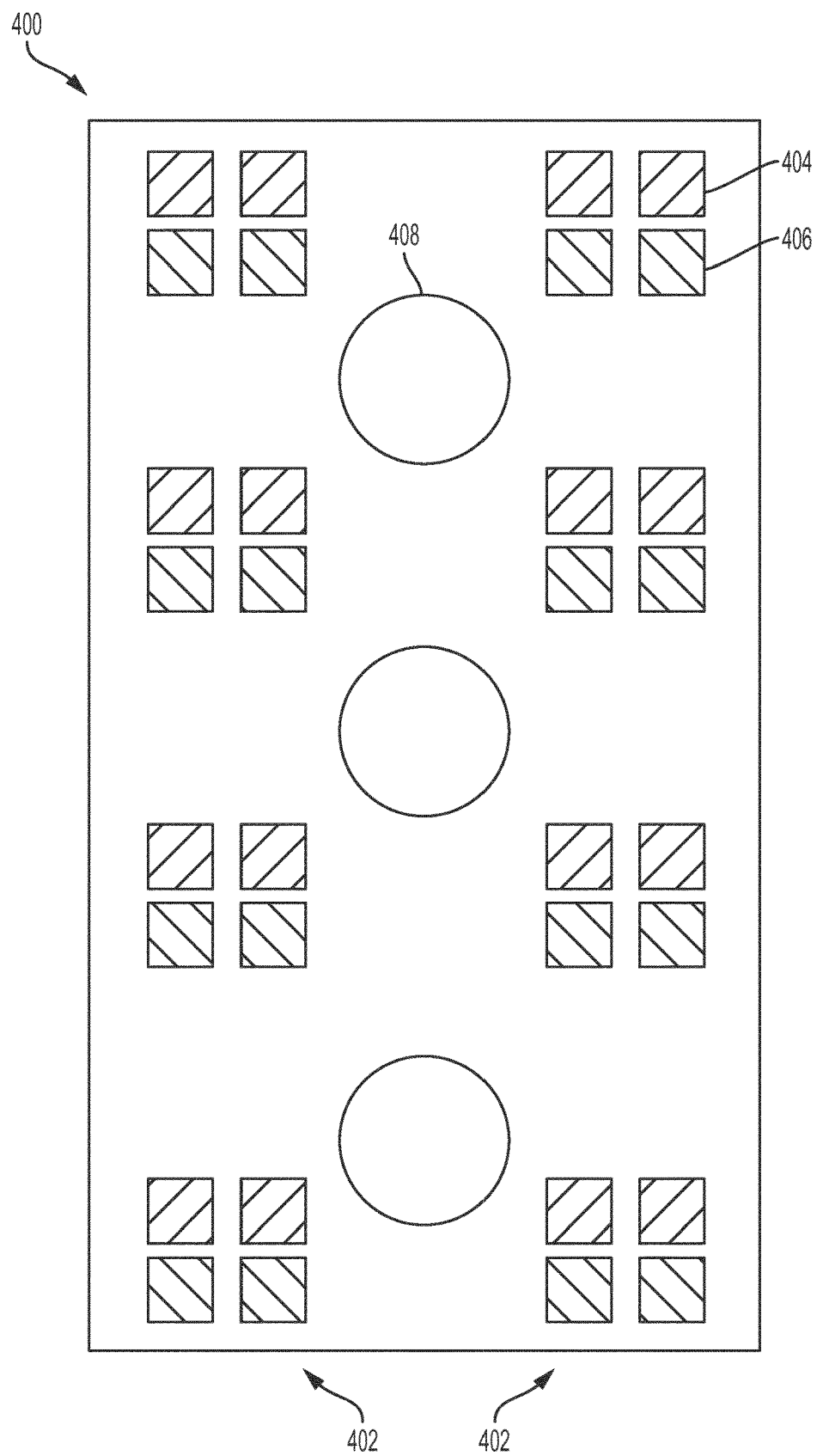
FIG. 4 is a front, schematic view of an LED display without diffuser structures according to another of the present disclosure.

FIG. 4 shows a schematic of a configuration 400 further supporting polarized 3D with audio ports 408 according to one example. Shown are eight clusters 402, each including four LED packets. The first pair of LED packets of each cluster can have a first polarizer 404 located between the first pair of LED packets and a diffuser (not shown) so that light emitted from each LED of the two LED packets passes through the first polarizer 404 to produce polarized light of a first polarizing orientation. The second pair of LED packets of each cluster can have a second polarizer 406 located between the second pair of LED packets and the diffuser so that light emitted from each LED of the second pair of LED packets passes through the second polarizer 406 to produce polarized light of a second polarizing orientation. Emitted light from the LEDs of a first polarizer 404 and the LEDs of a second polarizer 406 in the same cluster may be directed to the same quadrant in the diffuser structure using lenslets or other optical structures. The surface of the light diffuser structures may be designed or treated to be light diffusing while conserving polarization, for example by an embossed pattern. The polarizers 404, 406 may be small discs of absorbing polarizer film and the polarizers may be circular polarizers or linear polarizers. The polarizers 404, 406 may be mounted to the light diffuser structures prior to the light diffuser structures being mounted onto the PCB. The polarizers may have glue on both sides to attach the light diffuser structures to the LEDs. Alternatively, the polarizers may be located in or on another location of the light diffuser structure to polarize emitted light from the LED.

Alternatively or additionally to polarizers 404, 406, color filters may be positioned between the LED and the light diffuser structure to manage the color spectrum of emitted light of at least one of the LEDs. One type of color filter can filter light in accordance with a first spectrum of color and another type of color filter can filter light in accordance with a different spectrum of color. This may enable the display to support larger color gamuts, such as DCI-P3 and Rec2020. Color filters may also enable or improve 3D viewing with spectrum separation filters in 3D glasses. In such a configuration, light emitted by a first set of LEDs through a first set of color filters may be transmitted through a first eye-filter in a pair of 3D glasses and essentially blocked by a second eye-filter in the pair of 3D glasses, while light emitted by a second set of LEDs through a second set of color filters may be transmitted through said second eye-filter in the pair of 3D glasses and essentially blocked by the first eye-filter in the pair of 3D glasses. Alternatively to using color filters in front of LEDs for 3D display, the LEDs can be selected to have color characteristics matching spectral filters in 3D glasses. In this configuration, for example, light emitted by a first set of LEDs may be transmitted through a first-eye filter in a pair of 3D glasses and be substantially blocked by a second-eye filter in the pair of 3D glasses. And, light emitted by a second set of LEDs may be transmitted through the second-eye filter and substantially blocked by the first-eye filter. In some examples, a subset of the LEDs can output light having a first color spectrum and a second subset of LEDs can output light having a different color spectrum that does not spectrally overlap the first color spectrum.

Figure 5A:
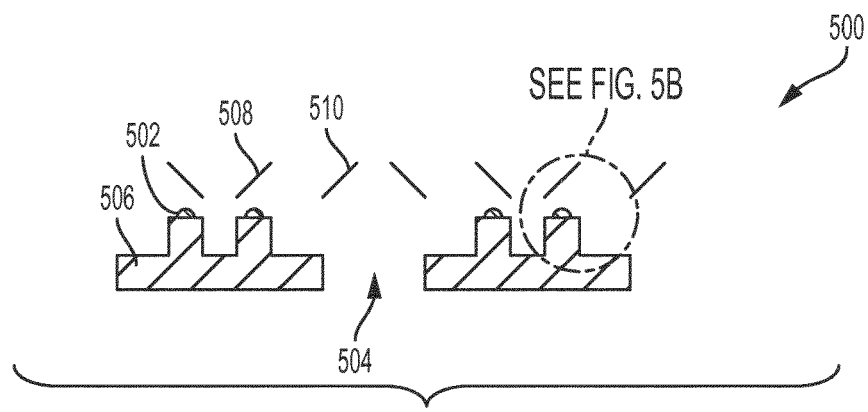
FIG. 5A is a cross-sectional, schematic view of an LED display according to one example of the present disclosure.
Figure 5B:
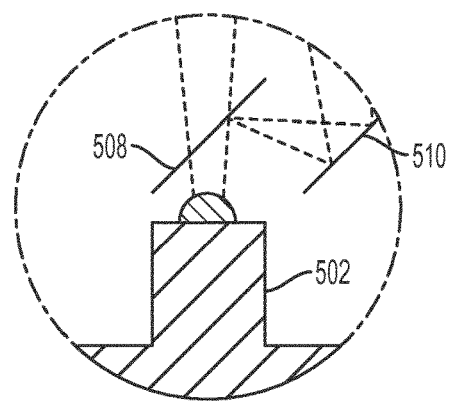
FIG. 5B is a close-up view of part of the LED display of FIG. 5A according to one example of the present disclosure.
Figure 6:
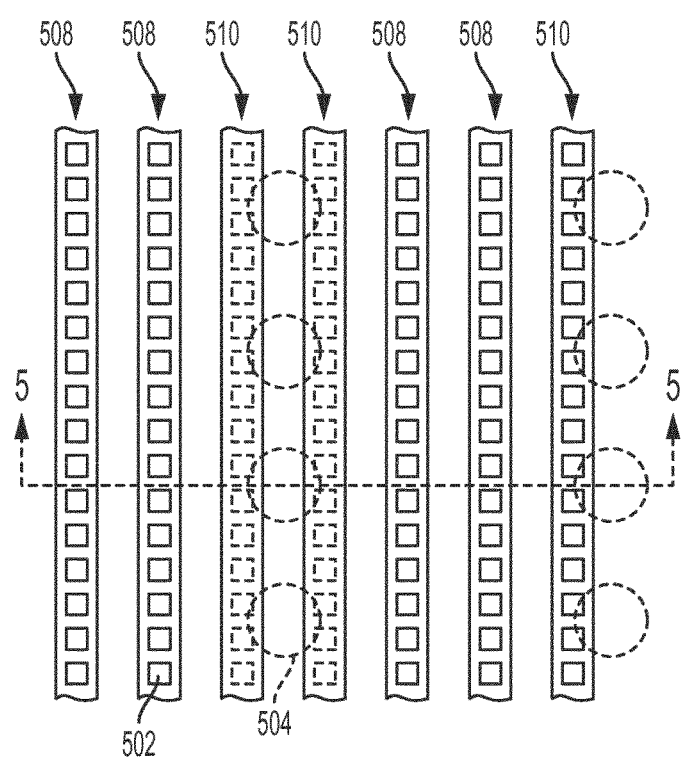
FIG. 6 is a front, schematic view of the LED display of FIG. 5A according to one example of the present disclosure.

FIG. 5A is a cross-sectional view of an alternative configuration 500, where the light diffuser structures coupled to a PCB 506 are replaced by light conditioning structures that include beam splitters 508 and mirrors 510. FIG. 6 is a front view of the configuration of FIG. 5A. In FIG. 6, the beam splitters 508 and corresponding mirrors 510 are in alternating vertical columns, with audio ports 504 shown. A beam splitter 508 can split an original beam of light emitted from an LED 502 into a first beam of light and a second beam of light, as shown in the close-up view of FIG. 5B. The first beam of light can pass through the beam splitter 508 and continue in the same direction as the original beam of light. And, the second beam of light can be reflected by the beam splitter 508 with an angle, such as 90 degrees, to be incident on a mirror 510 that reflects the second beam of light in the same direction as the first beam with an angle so it is essentially parallel to the direction of the original beam, but is offset with a distance essentially equal to the average spacing between the light emitting pixels of the display. Alternatively or additionally, one or more other optical structures may be included. An example of a structure is a waveguide. The optical structures may help in directing beams of light from LEDs to transmissive (also referred to as non-opaque) areas on the diffuser surface.

Alternatively, the light diffuser structures may be replaced by other configurations that provide a similar effect as opaque masking patterns on light diffuser structures to camouflage screen-door effects. In other examples, a different camouflaging pattern can be used that reduces the visibility of the gaps as compared to other configurations. The alternative camouflaging pattern may be designed to have low frequency filtering resulting in a lower RMS amplitude than a low frequency filtering of the gap pattern without camouflaging. The low frequency filtering may be essentially equal to the low frequency filtering that naturally occurs with the retina of an eye where an observer is seated in a front row in a cinema, such as a seat located approximately five meters from the display.

Figure 7:
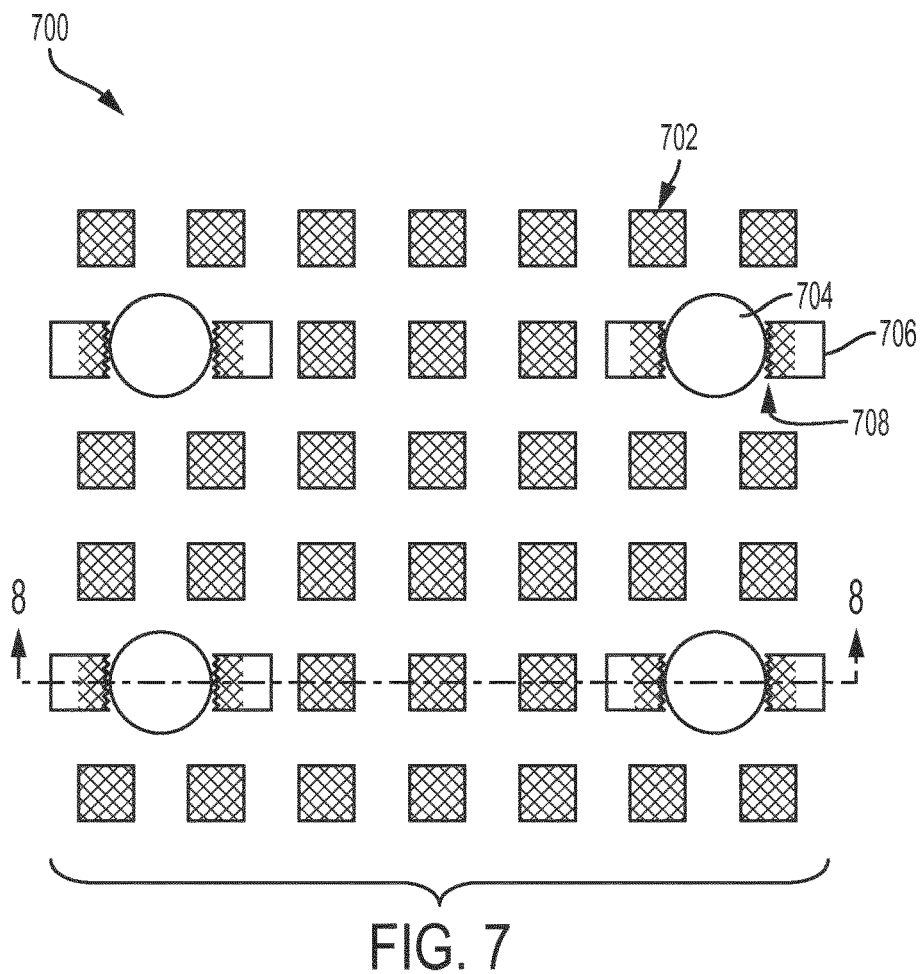
FIG. 7 is a front, schematic view of an LED display according to another example of the present disclosure.

FIG. 7 is a front view of another example of an LED display 700 with audio ports 704. A high density of LED packets 702 located at points of a regular pattern can ensure that the spatial cycle of repetitive patterns are kept below a level that is resolved by the eye of an observer in the front row, and in a number of locations, audio ports 704 are included. Two LED packets on each side of an audio port 704 are displaced relative to the regular pattern position of LEDs to increase the space between the LED packets for a larger audio port 704. On the top of the two LED packets adjacent to the audio port, opaque masking 706 is applied to camouflage the shift (caused by shifting the LED packets) in the light-emitting portion of the pixel position by causing the centroid of brightness of the light emitting section of the shifted pixel to appear to be spatially consistent with the spacing between the brightness centroids of the other light emitting pixels that have not been displaced for the audio port 704. For example, the camouflage pattern at each shifted LED packet may be transparent in a small elongated area at the side towards the audio hole such that the brightness centroid of the small elongated areas is close to the position of the brightness centroid would have been if the shifted LED packet had been located in the position that is consistent with the regular pattern of LED packets 702 that were not shifted. The transparent area 708 may cover 20% of the light emitting area and the LED brightness may be increased by a factor of five to ensure the total light output from the LED packet is the same as it would for the LED packets without the camouflage masking alteration. The camouflage alteration may include an opaque-masking pattern with any other shape and further include other densities than transparent and opaque. Alternatively or additionally, an optical structure may be included that moves the brightness centroid towards one side of the LED packet. Examples of the optical structure include a prism, a lens, light guide, and a reflector.

The resolution of the display may be different from the number of LED packets 702. For example, each cluster of 2×2 LED packets 702 may emit essentially the same color and constitute one pixel.

Figure 8:
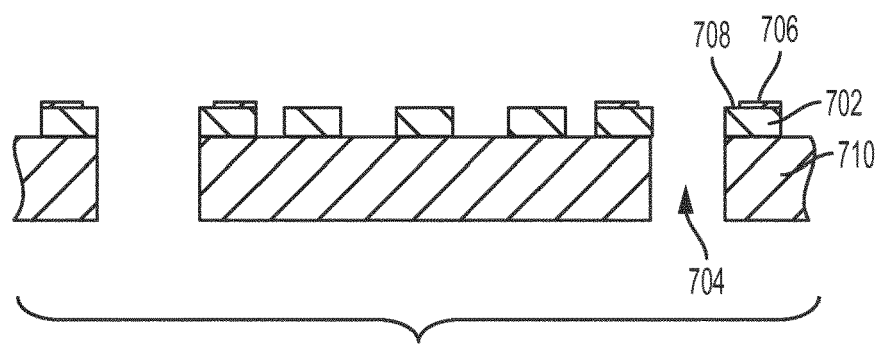
FIG. 8 is a cross-sectional, schematic view of part of the LED display of FIG. 7 according to one example of the present disclosure.

FIG. 8 is a side view of a section through the audio ports 704 of the example of FIG. 7. In one example, the printed circuit board 710 may have a thickness of 1.6 mm and the LED packets 702 may have a height of 0.6 mm above the printed circuit board 710, and the diameter of the audio ports 704 may be 2.2 mm.

Figure 9:
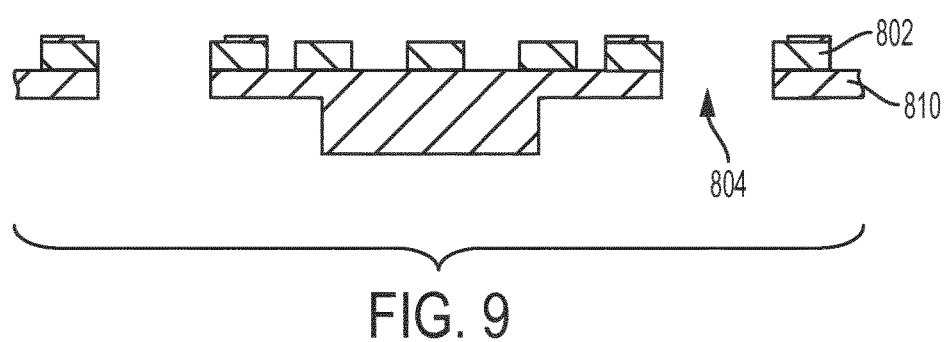
FIG. 9 is a cross-sectional, schematic view of part of the LED display of FIG. 7 according to another example of the present disclosure.

FIG. 9 is a side view of another example of the configuration of FIG. 7. Additionally or alternatively to including displaced adjacent LED packets 802, some of the material to the sides of the audio ports 804 on the side of the printed circuit board (PCB) 810 facing away from the LED packets 802 can be milled away to reduce the length of path of the narrower portion of the audio port for the audio waves to pass through the display, which can improve audio transmission characteristics. Alternatively, the PCB 810 may be constructed of thinner material but include additional material attached to cover less area of the PCB 810 to provide greater rigidity to the thinner PCB without influencing the audio port audio performance characteristics. For example, additional material to improve PCB rigidity can be applied by adhesive or by mechanical couplers, such as mechanical fasteners.

Figure 10:
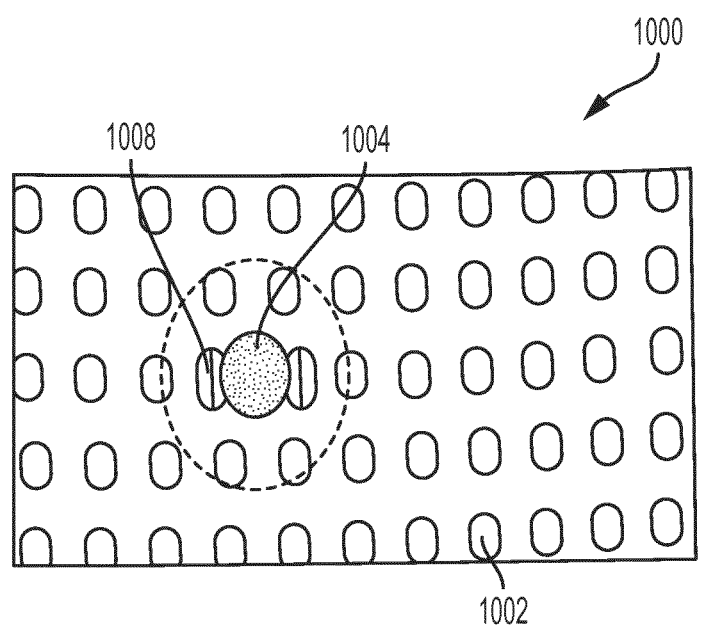
FIG. 10 is a front view of an arrangement of displaced LEDs on a photograph of an LED display section according to one example of the present disclosure.

FIG. 10 shows a simulation of an LED cinema display 1000 with the displacement of adjacent LED packets 1002 and opaque masking camouflage pattern 1008 applied to the LED packet closest to the audio port 1004. The area of the audio port is shown as a disc.

Figure 11:
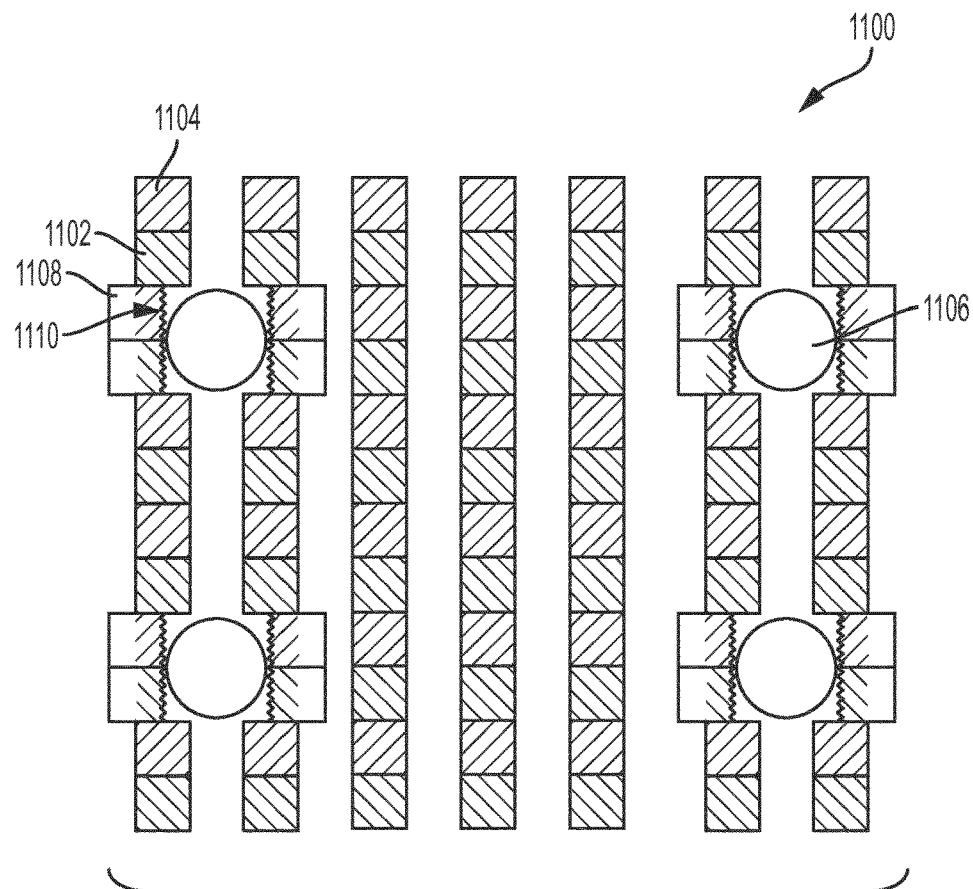
FIG. 11 is a front, schematic view of an LED display with some LEDs offset according to one example of the present disclosure.

FIG. 11 shows an example of a 3D LED display 1100 for emitting polarized light and that has LEDs behind transmissive areas 1102, 1104. LED packets associated with transmissive areas 1102, 1104 emit polarized light, for example by using absorptive polarizers, in a pattern of alternating characteristics, for example right-handed circular polarization and left handed circular polarization. The LED packets next to the audio port 1106 can be displaced. A portion of the transmissive area 1102, 1104 can be covered by camouflage masking 1108, leaving a reduced light-emitting portion 1110.

In FIG. 11, the LED display 1100 can include LED packets associated with each of the transmissive areas 1102, 1104. Each LED packet can have a length and width of 1.0 mm×1.0 mm and are mounted with a horizontal distance between the centers of 2.6 mm and a vertical distance between them of 1.3 mm. A pixel may include a cluster of two LED packets horizontally by four LED packets vertically, in a pattern of alternating polarization. For example, an LED associated with transmissive area 1102 can have first polarization characteristics and an LED associated with transmissive area 1104 can have second polarization characteristics. In addition to left-eye and right-eye 3D image encoding using polarization, the LED cluster can also include another 3D encoding that uses color separation. For example, the LED packets associated with transmissive area 1102 of a first polarization direction within the cluster may emit light of a first color and the LED packets associated with transmissive area 1104 of a second polarization direction within the cluster may emit light of a second color. The first color can be the color of a first-eye perspective of an image point and the second color can be the color of a second-eye perspective of the same image point.

The horizontal and vertical pixel pitch can then be 5.2 mm and the total resolution of the display may be 4K, i.e. 4096 pixels horizontally, which results in a display width of 70 feet.

The spatial cycle observed through polarized 3D glasses can have a length of 2.6 mm both horizontally and vertically. A person with 20/20 vision may not be able to resolve these cycles at distances greater than 0.0026 m/tan(1/60)=8.9 m.

Figure 12:
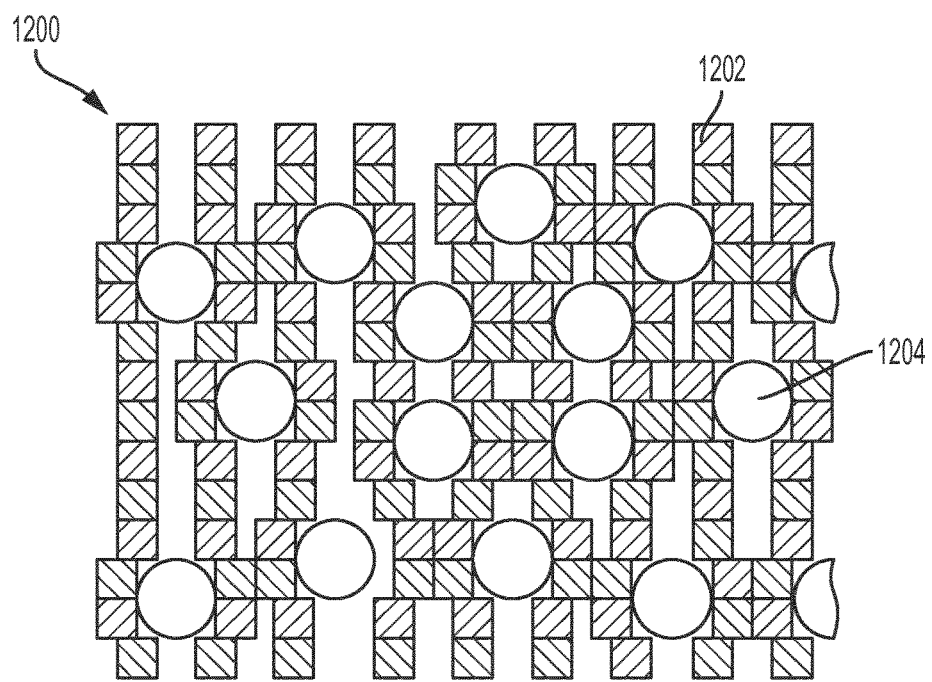
FIG. 12 is a front, schematic view of an LED display with some LEDs offset according to another example of the present disclosure.

FIG. 12 is a front view of an example of an LED display 1200 with audio ports 1204 located in a non-uniform pattern, additionally or alternatively to the camouflage masks (e.g., opaque masking) previously described. Since the eye/brain system is less sensitive to spatial cycles when they appear in a non-uniform pattern, this may allow a greater deviation of the optical center of brightness of LED packets and associated transmissive areas 1202 over an LED display 1200 with a camouflage masking pattern compared to using a camouflage masking pattern with respect to the regularly spaced LED packet and transmissive area pattern over an LED display area. Hence, a smaller fraction of the camouflage pattern may be opaque and the light loss less, and the LED may need to have its brightness increased by a reduced amount, as compared to compensating with a mask over a regular pattern of LEDs to compensate. In some examples, the camouflaging mask can be omitted and the camouflaging effect in locating the audio ports in a non-uniform pattern can be relied on, or relied on in combination of further increasing the area of the audio port at the back of the screen relative to the area of the audio port size at the side of the screen facing a viewer. In one example, a theatre includes an audience seating area and a display for outputting or reflecting light representing a visual presentation toward the audience seating area. The display includes one or more LED panels that include LED lights controllable for outputting the light that represents the visual presentation. At least one LED panel includes a body that defines an audio port therethrough. The audio port can allow sound waves to pass through the LED panel and toward the audience seating area such that the audience may experience sound as if it were coming from the display. Also included are one or more structures or configurations described above or shown in the figures of the present disclosure for reducing or minimizing screen-door effect because of the presence of the audio ports.

Figure 13:
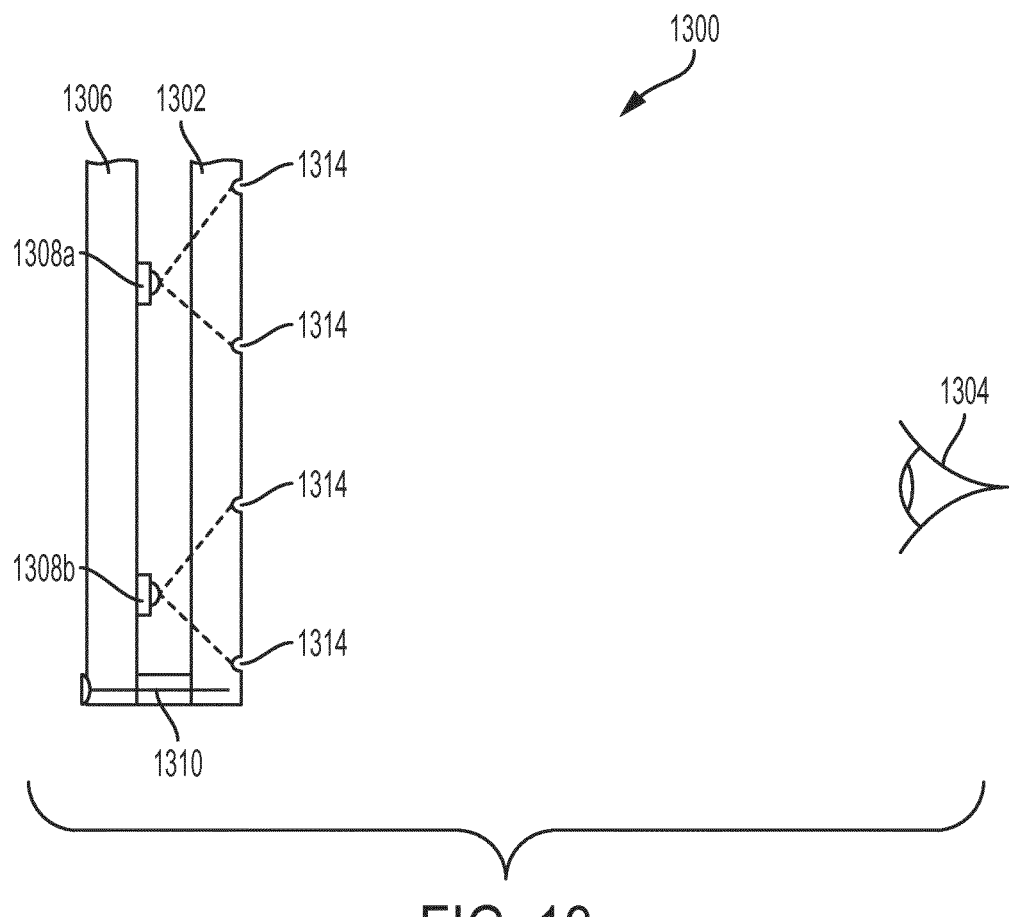
FIG. 13 is a schematic side view of an active display configuration according to one example of the present disclosure.
Figure 14:
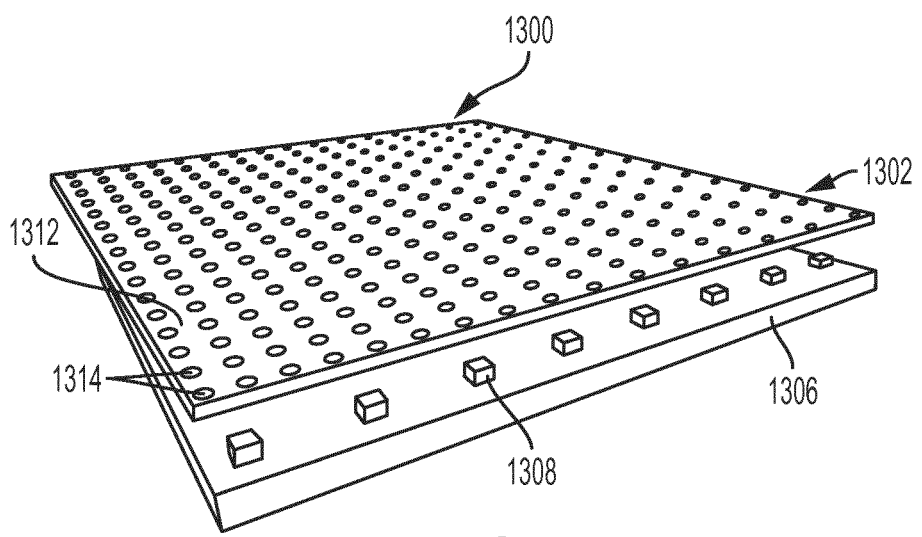
FIG. 14 is a perspective view of the active display configuration of FIG. 13 according to one example of the present disclosure.

FIG. 13 is a schematic side view of an active display configuration 1300 according to one example. FIG. 14 shows the same example via perspective view. The configuration 1300 includes a diffuser structure 1302 positioned between an audience-viewing area 1304 and a body 1306 that can be a PCB on which active light-emitting elements 1308a-b are positioned. Two active light-emitting elements 1308a-b are shown in FIG. 13, but any number can be used, as illustrated in FIG. 14, which includes more light-emitting elements 1308. The diffuser structure 1302 can be coupled to the body 1306 at one or more positions. For example, a mounting screw 1310 (shown in FIG. 13), going through the body 1306 and into the diffuser structure 1302 outside of the optical path from the light-emitting elements 1308a-b can be used to couple the diffuser structure 1302 to the body 1306.

On a surface of part of the diffuser structure 1302 that is facing the audience-viewing area 1304 is a mask formed in this example by opaque paint 1312. The paint 1312 can substantially block light from passing through the opaque portions between the openings 1314. For example, the paint 1312 may block 99% of light from passing through the opaque portions. The paint 1312 can be selected such that it provides low light reflectivity toward the audience-viewing area 1304. An example of a color of the paint 1312 is black that can absorb ambient light in the theatre.

Included in the mask are non-opaque (or transparent) portions 1314 that form openings for light to pass through. More than one non-opaque portion 1314 can correspond to each light-emitting element 1308. The non-opaque portions 1314 can be disc-shaped light openings arranged in a regularly spaced matrix. The light-emitting elements 1308 can be LED pixels that each have a light-emitting angle such that emitted light covers four light openings formed by the non-opaque portions 1314, and essentially none of the other openings or edges of the diffuser structure 1302. Alternatively or additionally, light baffles (not shown) may be mounted to one or more sides of light-emitting elements 1308 to restrict light emission angles.

Figure 15:
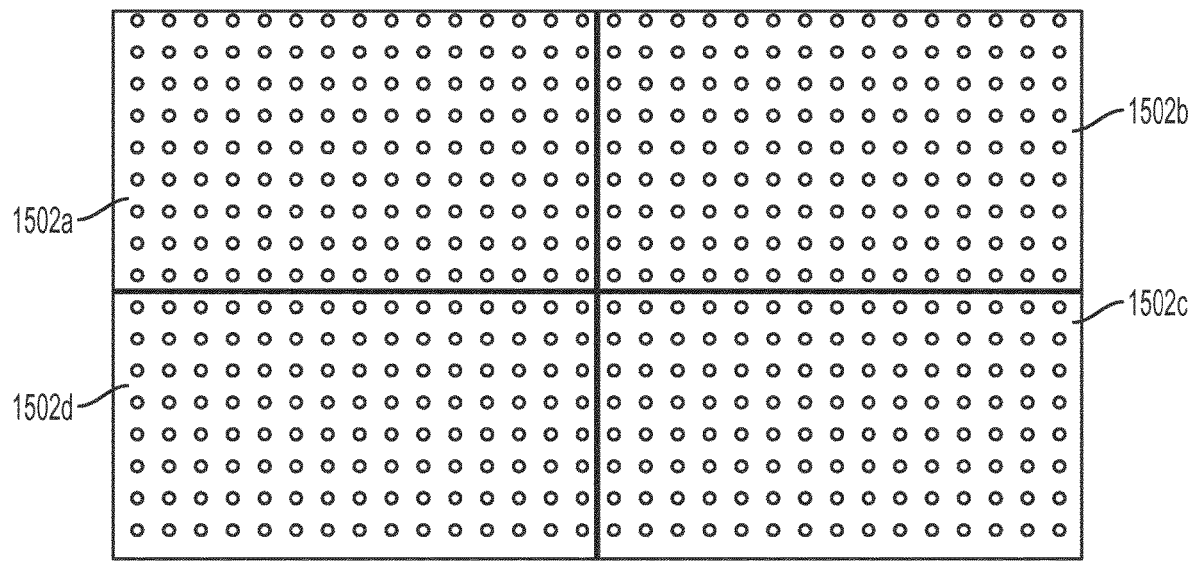
FIG. 15 is a front view of pixel tiles according to one example of the present disclosure.

FIG. 15 shows a boundary between pixel tiles 1502a-d according to one example. Four pixel tiles 1502a-d are shown in FIG. 15, but any number can be used. Each of the pixel tiles 1502a-d may have a configuration that is the same or similar to FIGS. 13 and 14, and each includes a diffuser structure. In low ambient light, the edges of the diffuser structure at the boundaries are not visible, provided the pixel tiles 1502a-d are mounted so the distance between pixels across boundaries do not deviate more from the general distance between pixels, also referred to as the pixel pitch, than a certain threshold.

Figure 16:
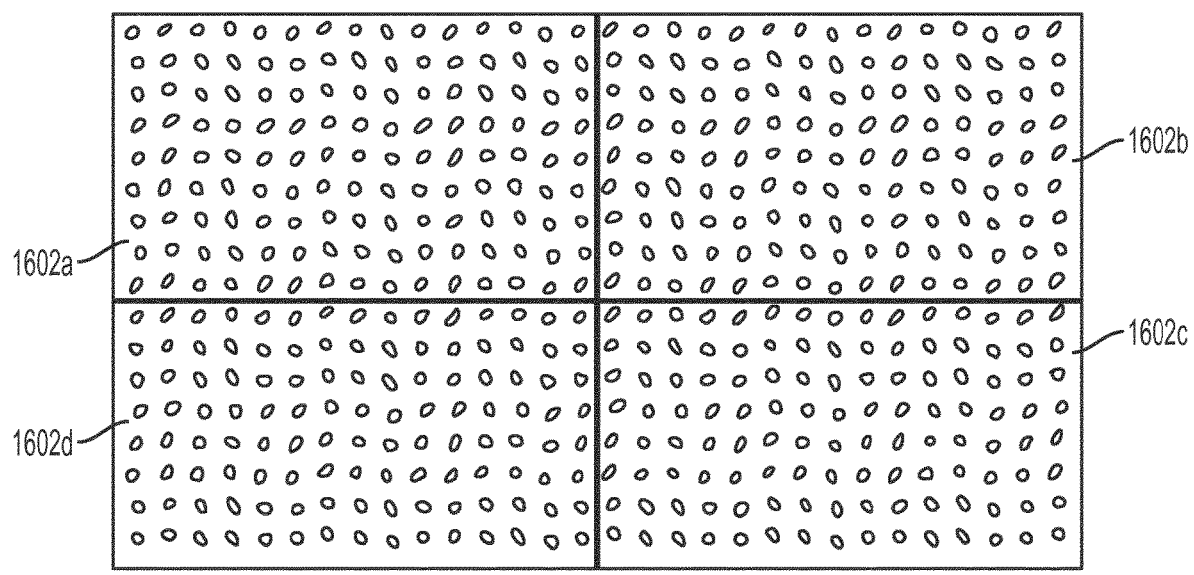
FIG. 16 is a front view of pixel tiles according to another example of the present disclosure.

FIG. 16 shows an example of an alternative configuration of pixel tiles 1602a-d. The pixel tiles 1602a-d have light openings formed by non-opaque portions of a mask. And the light openings have varied shapes and slightly offset locations, rather than being in a regularly spaced matrix. This configuration may have a slightly more pleasing appearance when viewed at a closer distance than the minimum viewing distance for which it is designed.

Figure 17:
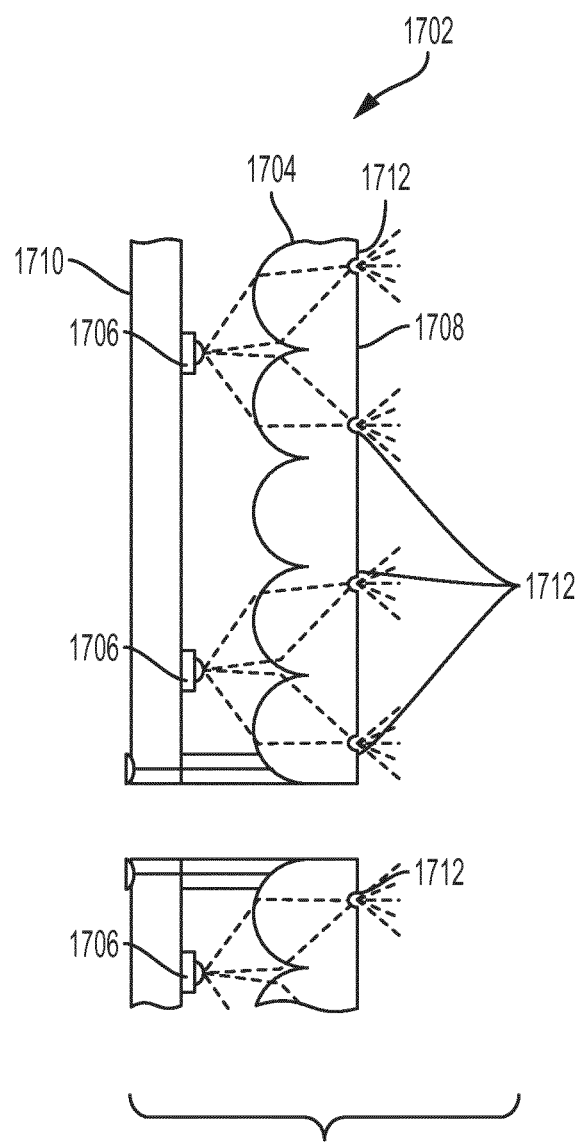
FIG. 17 is a schematic, side view of part of pixel tiles for a display in which a lens array is positioned between light-emitting elements and a diffuser structure according to one example of the present disclosure.

FIG. 17 shows an alternative configuration of part of pixel tiles 1702 for a display in which a lens array 1704 is positioned between light-emitting elements 1706 and a diffuser structure 1708 (or part of the diffuser structure 1708) to improve the optical efficiency of the light emitted through the non-opaque areas 1712. The light-emitting elements 1706 may be LEDs coupled to a body 1710, such as a PCB. The lens array 1704 may increase the range of allowable light-emitting angles from light-emitting elements 1706. For example, the lens array 1704 can focus light from light-emitting elements 1706 onto non-opaque areas 1712 of the diffuser structure 1708. Alternatively or additionally, another optical structure, other than a lens array, may be included to improve the optical efficiency, for example by directing a larger fraction of light emitted from LEDs to non-opaque areas. The optical structures may include one or more light guides, which may include total internal reflection surfaces that can be part of a molded structure that includes the diffuser structure 1708. Alternatively or additionally, the size of the non-opaque areas may be maximized while still allowing dark gaps therebetween that are large enough to camouflage dark gaps at audio ports and pixel tile boundaries so as to increase light throughput and efficiency.

Figure 18:
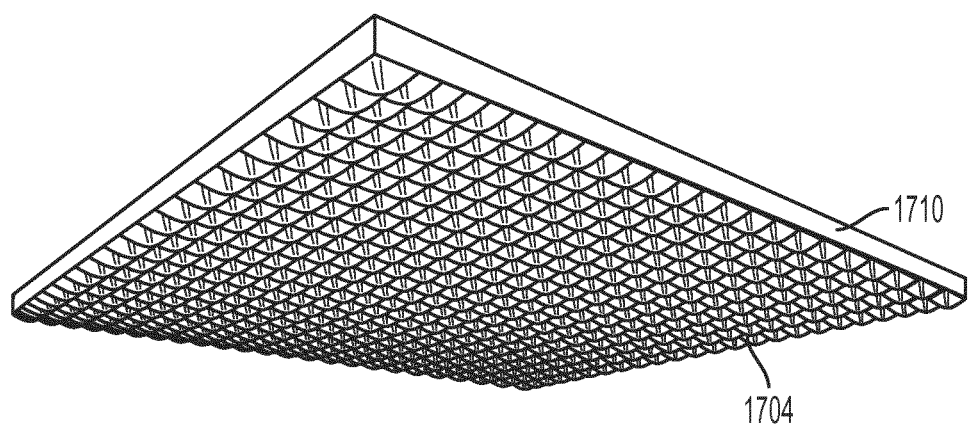
FIG. 18 is a perspective view of the lens array of FIG. 17 according to one example of the present disclosure.
Figure 19:
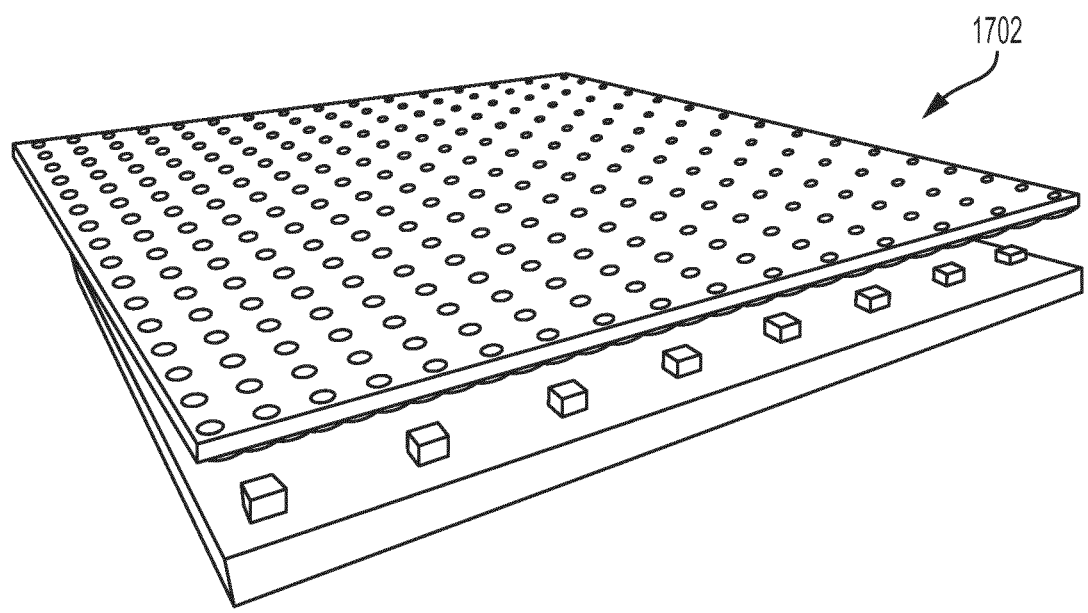
FIG. 19 is a perspective view of part of pixel tiles of FIG. 17 according to one example of the present disclosure.

FIG. 18 shows a perspective view of an example of the lens array 1704 of FIG. 17, viewed from the side facing towards the body 1710. FIG. 19 shows a perspective view of the configuration of part of the pixel tiles 1702 from FIG. 17.

Figure 20:
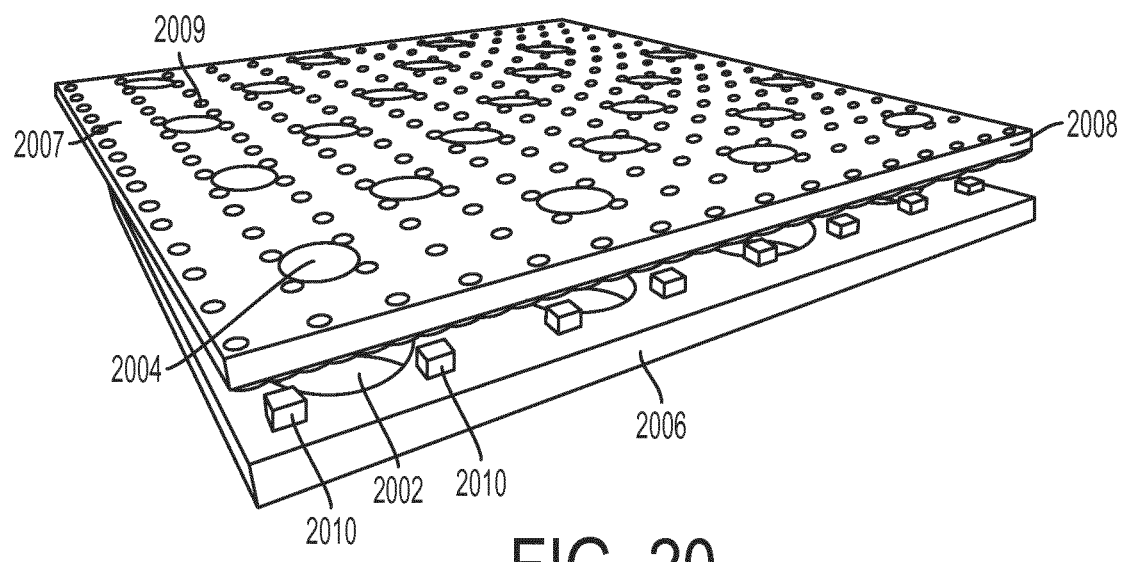
FIG. 20 is a perspective view of an active display configuration with audio ports according to one example of the present disclosure.

FIG. 20 shows a perspective view of an example of a configuration similar to that in FIG. 17, but further including audio ports 2002, 2004 in both a body 2006 and in a diffuser structure 2008. The diffuser structure 2008 can include opaque areas 2007 and non-opaque areas 2009. Audio ports 2002 in the body 2006 may be circular and maximized in diameter, while still fitting between light-emitting elements 2010. Audio ports 2004 in the diffuser structure 2008 may be circular and maximized in diameter, while still fitting in between non-opaque areas 2009. Although shown as circular, audio ports 2002, 2004 in other examples may have other shapes.

Any number of audio ports 2004 can be included in the diffuser structure 2008 and can be any size. The audio ports 2004 have a smaller area than the area of the audio ports 2002 in the body 2006. In some examples, an audio port 2002 has an area that is three times (or more) larger than the area of an audio port 2004 in the diffuser structure 2008. The acoustical impedance to sound waves passing through the audio ports 2002, 2004 can be influenced by the audio port 2004 in the diffuser. A smaller opening for the audio port 2004 in a front surface and one defined by a thin material (e.g., a material having a thickness less than 0.030 inches), can act similarly as a hole in a vinyl screen used in film theatres to allow sound waves to pass therethrough. An audio port 2002 in the body 2006 can correspond to an audio port 2004 in the diffuser structure 2008 if the two respective audio ports 2002, 2004 align or substantially align such that the same sound energy passes through both audio ports 2002, 2004. In other examples, the proportion of the area of the audio ports 2002 may be much larger than the area of the audio ports 2004 such that substantial alignment between each audio port is less critical for allowing sound waves to pass therethrough. Although in the example, the body 2006 is a PCB, the body 2006 can be other types of structures.

The number of audio ports 2004 in the diffuser structure 2008 can vary, but in some examples, the total percentage area of the diffuser structure 2008 that are audio ports 2004 can be in a range of 4% to 8%. In other examples, the total percentage area that is audio ports 2004 is greater than 8%. Not all of the audio ports 2004 may correspond, in a one-to-one correspondence, to an audio port 2002. For example, sufficient sound waves may be allowed to pass through a display where 8% of the total diffuser area is audio ports 2004 in which half of the audio ports 2004 correspond with audio ports 2002.

In some examples, sound waves may be directed from behind certain portions of the display and the audio ports 2002, 2004 can be sized such half of the sum of the area of the audio ports 2004 correspond with audio ports 2002 to allow sufficient sound to pass through. For example, if 8% of the area of the diffuser structure 2008 has audio ports 2004, then the audio ports 2002 in the body 2006 can align or correspond with at least half of the audio ports 2004, effectively making at least 4% of the area of the diffuser structure 2008 with audio ports 2004 be capable of allowing sound to pass through the display.

A diffuser structure with a mask that includes opaque portions and non-opaque portions can be combined with additional innovations for providing an enhanced experience in viewing a light-emitting display, such as for viewing a video presentation in an immersive viewing environment—for example, an environment provided by IMAX Corporation.

In one example, the diffuser structure with the mask can be used with a light-emitting active display in which content to be displayed by each tile of the display is delivered to the tile by one or more wireless emitters and received via one or more wireless detectors, as described in U.S. Provisional Application Ser. No. 62/545,080, titled "LED Display with Distributed Optical Communication" and filed on Aug. 14, 2017.

In another example, the diffuser structure with the mask can be used in a light-emitting display that is provided with sub-pixels, where the LED display has an increased color gamut and where an increased fraction of LEDs from a production batch can be used, as described in U.S. Provisional Application Ser. No. 62/581,852, titled "Wide Gamut LED Pixel with Screen-door Reduction and High LED Selection Yield" and filed Nov. 6, 2017.

In another example, the diffuser structure with the mask can be used in an active display with pixels having multiple LEDs per color plane, where the LEDs may be multiplexed to reduce a number of pulse width modulators required and to reduce strobing artifacts, as described in U.S. Provisional Application Ser. No. 62/583,059, titled "Pixel with Multiple LEDS for Color Plane" and filed Nov. 8, 2017.

In another example, the diffuser structure with mask can be used in an active display with tiles and data processing as described in U.S. Provisional Application Ser. No. 62/560,922 titled "Light emitting display with tiles and data processing." In such a configuration, locations for pixels may instead refer to locations of non-opaque areas.

These and other examples can also be combined together to form an active display with enhanced features.

Figure 21:
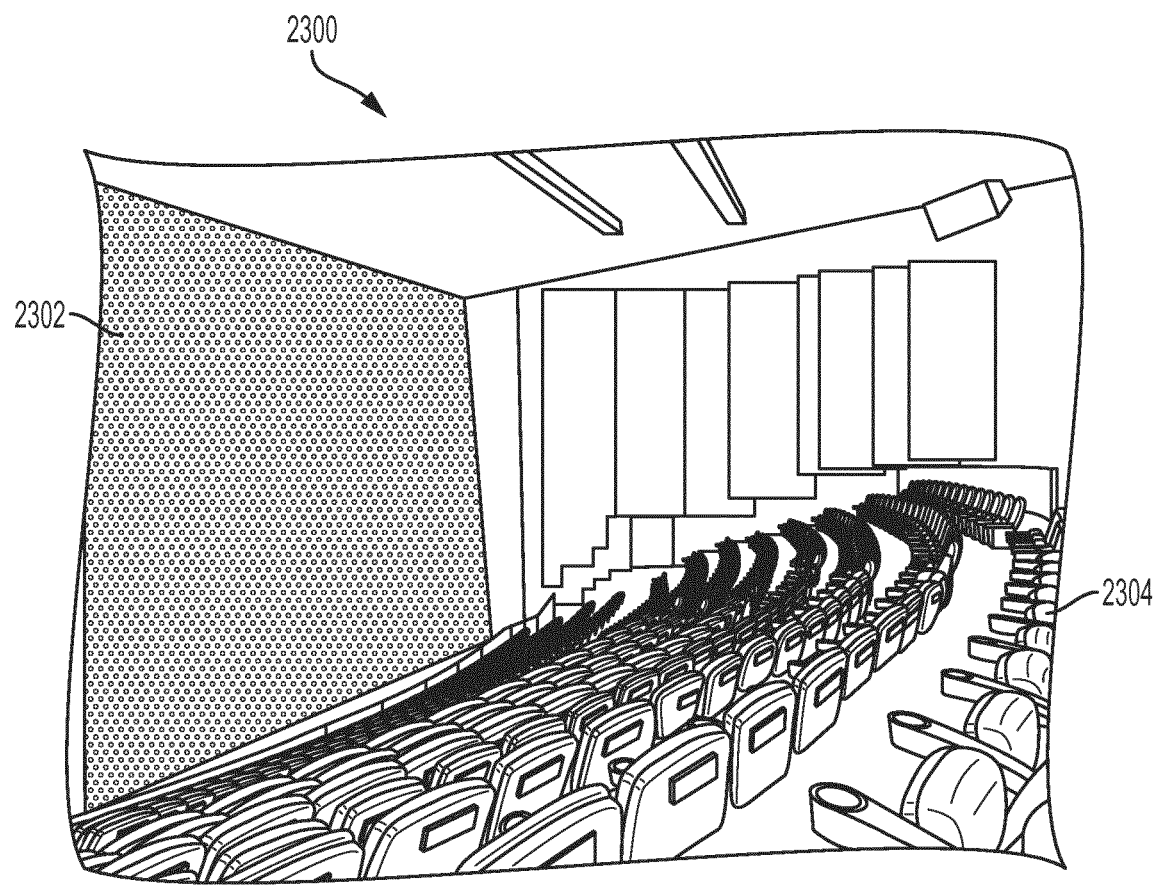
FIG. 21 is a perspective view of a theatre environment that includes an active display with reduced screen-door effect according to one example of the present disclosure.

Various aspects of the present disclosure can be used in a theater environment, such as an immersive theater environment provided by IMAX Corporation, that has an active display with reduced screen-door effect. FIG. 21 is a perspective view of a theatre environment 2300 that includes an active display 2302 with reduced screen-door effect. The active display 2302 can include light-emitting elements that output light that can represent a visual presentation, such as a movie, toward an audience-seating area 2304. The active display 2302 can also include one or more of the features described previously. For example, the active display 2302 may include ports through which sound waves can pass through the active display 2302 and toward the audience-seating area 2304. Because the active display 2302 can output light representing a visual presentation toward the audience-seating area 2304, the theatre environment 2300 may not be required to include projection equipment, as would otherwise normally be used for non-active displays in theatre environments.

The theatre environment 2300 can be an immersive one that provides increased resolution, as compared to a typical theatre, and the audience-seating area 2304 can be much closer to the active display 2302 than as compared to a typical theatre. For example, all rows of seats in the audience-seating area 2304 can be a distance from the active display 2302 that is within one screen height of the active display 2302. For example, the active display 2302 can be much larger than a typical theatre display—e.g., a length of approximately 70 feet and a height of approximately 50 feet (or even as large as approximately 117 feet in length and approximately 100 feet in length). In the example in which the active display 2302 has a height of approximately 50 feet, all of the seats in the audience-seating area 2304 can be within 50 feet from the active display 2302. The theatre environment 2300 may be in a purpose-built structure for an immersive theatre experience, or in a retrofitted auditorium that formally house a typical theatre environment.

In other examples, an active display with reduced screen-door effect according to various aspects can be used in a typical theatre environment in which the audience-seating area is farther from the active display (e.g., 8 to 12 screen heights away) and the size of the active display is smaller than the example described in connection with FIG. 21.

As used below, any reference to a series of examples is to be understood as a reference to each of those examples disjunctively (e.g., "Examples 1-4" is to be understood as "Examples 1, 2, 3, or 4").

Example 1 is an LED panel for a display that is positionable in a theatre, the LED panel comprising: a plurality of LEDs; and a body defining at least one audio port between at least two LEDs of the plurality of LEDs, the audio port being configured for allowing sound waves to pass from behind the display to a front of the display.

Example 2 is the LED panel of example(s) 1, further comprising: a diffuser mask positionable between the plurality of LEDs and an audience position in the theatre, the diffuser mask including alternating areas of opaque areas and transparent areas.

Example 3 is the LED panel of example(s) 2, wherein the transparent areas include at least two transparent areas per LED to create a visual effect of appearing to be more sources of LED light than a number of LEDs of the plurality of LEDs.

Example 4 is the LED panel of example(s) 2, wherein the diffuser mask includes, for each LED of the plurality of LEDs, a plurality of opaque areas and a plurality of transparent areas, the diffuser mask defining gaps therethrough that are configured to be visually indistinguishable with other areas of the diffuser mask.

Example 5 is the LED panel of example(s) 2, further comprising an optical element positionable between the plurality of LEDs and the diffuser mask, the optical element being configured to direct more of light from the plurality of LEDs to the transparent areas than to the opaque areas.

Example 6 is the LED panel of example(s) 5, wherein the optical element is a lenslet that is configured to prevent light from neighboring LEDs to a first LED of the plurality of LEDs from being directed to the transparent areas to which light from the first LED is directed.

Example 7 is the LED panel of example(s) 2, where a first subset of LEDs of the plurality of LEDs include a first polarizer and a second subset of LEDs of the plurality of LEDs include a second polarizer that is configured to polarize light differently than the first polarizer.

Example 8 is the LED panel of example(s) 7, wherein the first polarizer is configured to polarize light with a first orientation and the second polarizer is configured to polarize light with a second orientation, to allow 3D viewing using polarized stereographic glasses.

Example 9 is the LED panel of example(s) 8, wherein the diffuser mask is configured to conserve polarization of light polarized by the first polarizer and the second polarizer.

Example 10 is the LED panel of example(s) 2, wherein the diffuser mask defines a second audio port substantially aligned with the audio port defined by the body for allowing sound waves from a common source to pass through the audio port and the second audio port, the audio port defined by the body having an area that is at least three times greater than the area of the second audio port.

Example 11 is the LED panel of example(s) 10, wherein diffuser mask includes a portion to define the second audio port, the portion having a thickness that is approximately 0.030 inches.

Example 12 is the LED panel of example(s) 10, wherein the audio port is part of a plurality of audio ports defined by the body and the second audio port is part of a plurality of second audio ports defined by the diffuser mask, wherein at least half of the diffuser mask is the plurality of second audio ports that corresponds with the plurality of audio ports to form a path for sound waves to pass through the LED panel.

Example 13 is the LED panel of example(s) 1, wherein the plurality of LEDs include at least two LEDs, each LED of the at least two LEDs being offset horizontally with respect to other LEDs of the plurality of LEDs in the same vertical column as the LED, wherein the body defines the audio port at a position between the at least two LEDs for allowing audio waves to be outputted toward an audience.

Example 14 is the LED panel of example(s) 13, wherein the at least two LEDs are configured to have a centroid of brightness that is unshifted as compared to the other LEDs that are not offset horizontally.

Example 15 is the LED panel of example(s) 1, wherein a first subset of LEDs of the plurality of LEDs are configured to output light of a first color spectrum and a second subset of LEDs of the plurality of LEDs are configured to output light of a second color spectrum that is non-overlapping spectrally with the first color spectrum.

Example 16 is the LED panel of example(s) 1, wherein a first subset of LEDs of the plurality of LEDs has a first type of color filter and a second subset of LEDs of the plurality of LEDs has a second type of color filter that is configured to filter a different color spectrum than the first type of color filter.

Example 17 is the LED panel of example(s) 1, wherein the body defines a plurality of audio ports in a non-uniform pattern over an area of the LED panel.

Example 18 is the LED panel of example(s) 1, wherein the audio port is positioned between at least two columns of LEDs, the LED panel further comprising: a mirror positioned between the audio port and a column of LEDs; and a beam splitter positionable between the column of LEDs and an audience position in the theatre.

Example 19 is the LED panel of example(s) 18, wherein the mirror is included in a plurality of mirrors and the beam splitter is included in a plurality of beam splitters, the plurality of mirrors and the plurality of beam splitters being positioned in alternating vertical columns.

Example 20 is the LED panel of example(s) 18, wherein the beam splitter is configured to split light from an LED of the plurality of LEDs into a first beam of light in a first direction and a second beam of light in a second direction, wherein the mirror is configured to reflect the second beam of light to a path that is in the first direction, but that is offset to the first beam of light, to create a visual effect of appearing to be more sources of LED light than a number of LEDs of the plurality of LEDs in the LED panel.

Example 21 is the LED panel of example(s) 1, further comprising: a diffuser structure positionable between the plurality of LEDs and an audience position in the theatre, wherein the plurality of LEDs are configured to focus emitted light toward transmissive portions of the diffuser structure such that other portions of the diffuser structure remain dark.

Example 22 is the LED panel of example(s) 21, wherein the LED panel is positionable with respect to a second LED panel to form a gap therebetween that is configured to appear substantially similar to the portions of the diffuser structure that remain dark.

Example 23 is an active display that is positionable in a theatre, the active display comprising: a plurality of active light elements that form pixels for the active display; a diffuser structure positionable between the plurality of active light elements and an audience position in the theatre; and a mask on the diffuser structure, the mask being opaque and having at least two transparent areas per pixel of pixels formed by the plurality of active light elements to allow light from the plurality of active light elements to be emitted toward the audience position.

Example 24 is the active display of example(s) 23, wherein the plurality of active light elements include a plurality of LEDs.

Example 25 is the active display of example(s) 23, further comprising: a body defining an audio port positioned between at least two active light elements of the plurality of active light elements, for allowing audio waves to be outputted toward the audience position.

Example 26 is the active display of example(s) 23, further comprising: a lens array positionable between the plurality of active light elements and the mask.

Example 27 is the active display of example(s) 23, wherein at least some of the transparent areas have different shapes than the other transparent areas.

Example 28 is a method, comprising: outputting light from a plurality of light-emitting elements of an active display in a theatre; and allowing sound waves to pass through an audio port defined by a body of the active display, from behind the active display to a front of the display and toward an audience-viewing position.

Example 29 is the method of example(s) 28, further comprising: outputting light from the plurality of light-emitting elements toward the audience-viewing position through a diffuser mask that includes opaque areas and transparent areas to create a visual effect of the active display appearing to have more sources of light than a number of light-emitting elements of the plurality of light-emitting elements in the active display.

Example 30 is the method of example(s) 29, wherein the diffuser mask includes, for each light-emitting element of the plurality of light-emitting elements, a plurality of opaque areas and a plurality of transparent areas, the diffuser mask defining gaps therethrough that are visually indistinguishable with other areas of the diffuser mask.

Example 31 is the method of example(s) 29, further comprising: directing, by an optical element positioned between the plurality of light-emitting elements and the diffuser mask, more light from the plurality of light-emitting elements to the transparent areas than to the opaque areas.

Example 32 is the method of example(s) 29, further comprising: polarizing light form a first subset of the plurality of light-emitting elements in a first orientation; and polarizing light from a second subset of the plurality of light-emitting elements in a second orientation.

Example 33 is the method of example(s) 29, wherein the diffuser mask defines a second audio port substantially aligned with the audio port defined by the body for allowing sound waves from a common source to pass through the audio port and the second audio port, the audio port defined by the body having an area that is at least three times greater than the area of the second audio port.

Example 34 is the method of example(s) 29, wherein the plurality of light-emitting elements include at least two LEDs, each LED of the at least two LEDs being offset horizontally with respect to other LEDs of the plurality of light-emitting elements in the same vertical column as the LED, wherein the body defines the audio port at a position between the at least two LEDs for allowing audio waves to be outputted toward the audience-viewing position.

Example 35 is the method of example(s) 28, further comprising: splitting, by a beam splitter, light from a light-emitting element of the plurality of light-emitting elements into a first beam of light in a first direction and a second beam of light in a second direction; and reflecting, by a mirror, the second beam of light to a path that is in the first direction, but that is offset to the first beam of light, to create a visual effect of the active display appearing to have more sources of light than a number of light-emitting elements of the plurality of light-emitting elements.

Example 36. The method of example(s) 28, further comprising: focusing light emitted by the plurality of light-emitting elements toward transmissive portions of a diffuser structure of the active display that is positioned between the plurality of light-emitting elements and the audience-viewing position in the theatre such that other portions of the diffuser structure remain dark.

Example 37 is a method comprising: outputting light from a plurality of active light elements that form pixels for an active display in a theatre; and allowing the light to be emitted toward an audience position in the theatre through at least two transparent areas, of an otherwise opaque mask on a diffuser structure, per pixel of pixels formed by the plurality of active light elements.

Example 38 is the method of example(s) 37, further comprising: allowing audio waves to be outputted toward the audience position through an audio port defined by a body of the active display and positioned between at least two active light elements of the plurality of active light elements.

Example 39 is the method of example(s) 37, wherein the plurality of active light elements include a plurality of LEDs.

Example 40 is the method of example(s) 37, wherein the active display includes a lens array positioned between the plurality of active light elements and the mask.

Example 41 is the method of example(s) 37, wherein at least some of the transparent areas have different shapes than the other transparent areas.

Example 42 is the LED panel of example(s), wherein the opaque areas have black paint on a surface on the front of the display to absorb ambient light in the theatre.

While the present subject matter has been described in detail with respect to specific aspects thereof, it will be appreciated that those skilled in the art, upon attaining an understanding of the foregoing, may readily produce alterations to, variations of, and equivalents to such aspects. Any aspects or examples may be combined with any other aspects or examples. Accordingly, it should be understood that the present disclosure has been presented for purposes of example rather than limitation, and does not preclude inclusion of such modifications, variations, or additions to the present subject matter as would be readily apparent to one of ordinary skill in the art.

What is claimed is:

1. An LED panel for a display that is positionable in a theatre, the LED panel comprising:
    a plurality of LEDs, each LED of the plurality of LEDs representing a pixel of a plurality of pixels in the display; and
    a mask positionable between the plurality of LEDs and an audience position in the theatre, the mask including alternating areas of opaque areas and transparent areas positionable in a line-of-sight from the audience position, wherein the transparent areas include at least two transparent areas per LED to allow light from the plurality of LEDs to be emitted toward the audience position and to create a visual effect of appearing to be more pixels than a number of the plurality of LEDs.

2. The LED panel of claim 1, wherein the mask comprises a diffuser mask.

3. The LED panel of claim 2, wherein the diffuser mask includes, for each LED of the plurality of LEDs, a plurality of opaque areas and a plurality of transparent areas, the diffuser mask defining gaps therethrough that are configured to be visually indistinguishable with other areas of the diffuser mask.

4. The LED panel of claim 2, further comprising an optical element positionable between the plurality of LEDs and the diffuser mask, the optical element being configured to direct more of light from the plurality of LEDs to the transparent areas than to the opaque areas.

5. The LED panel of claim 4, wherein the optical element is a lenslet that is configured to prevent light from neighboring LEDs to a first LED of the plurality of LEDs from being directed to the transparent areas to which light from the first LED is directed.

6. The LED panel of claim 1, where a first subset of LEDs of the plurality of LEDs include a first polarizer and a second subset of LEDs of the plurality of LEDs include a second polarizer that is configured to polarize light differently than the first polarizer.

7. The LED panel of claim 6, wherein the first polarizer is configured to polarize light with a first orientation and the second polarizer is configured to polarize light with a second orientation, to allow 3D viewing using polarized stereographic glasses.

8. The LED panel of claim 7, wherein the mask is configured to conserve polarization of light polarized by the first polarizer and the second polarizer.

9. The LED panel of claim 1, wherein the opaque areas have black paint on a surface on the front of the display to absorb ambient light in the theatre.

10. The LED panel of claim 1, wherein a first subset of LEDs of the plurality of LEDs are configured to output light of a first color spectrum and a second subset of LEDs of the plurality of LEDs are configured to output light of a second color spectrum that is non-overlapping spectrally with the first color spectrum.

11. The LED panel of claim 1, wherein a first subset of LEDs of the plurality of LEDs has a first type of color filter and a second subset of LEDs of the plurality of LEDs has a second type of color filter that is configured to filter a different color spectrum than the first type of color filter.

12. The LED panel of claim 1, further comprising:
a diffuser structure positionable between the plurality of LEDs and an audience position in the theatre, wherein the plurality of LEDs are configured to focus emitted light toward transmissive portions of the diffuser structure such that other portions of the diffuser structure remain dark.

13. The LED panel of claim 12, wherein the LED panel is positionable with respect to a second LED panel to form a gap therebetween that is configured to appear substantially similar to the portions of the diffuser structure that remain dark.

14. The LED panel of claim 12, wherein the diffuser structure further comprises a diffuser positioned in the transmissive portions of the diffuser structure and the mask positioned in opaque portions of the diffuser structure.

15. The LED panel of claim 1, further comprising a body defining at least one audio port between at least two LEDs of the plurality of LEDs, the audio port being configured for allowing sound waves to pass from behind the display to a front of the display.

16. The LED panel of claim 15, wherein the diffuser mask defines a second audio port substantially aligned with the audio port defined by the body for allowing sound waves from a common source to pass through the audio port and the second audio port, the audio port defined by the body having an area that is at least three times greater than the area of the second audio port.

17. The LED panel of claim 16, wherein the diffuser mask includes a portion to define the second audio port, the portion having a thickness that is approximately 0.030 inches.

18. The LED panel of claim 16, wherein the audio port is part of a plurality of audio ports defined by the body and the second audio port is part of a plurality of second audio ports defined by the diffuser mask, wherein at least half of the diffuser mask is the plurality of second audio ports that corresponds with the plurality of audio ports to form a path for sound waves to pass through the LED panel.

19. The LED panel of claim 15, wherein the plurality of LEDs include at least two LEDs, each LED of the at least two LEDs being offset horizontally with respect to other LEDs of the plurality of LEDs in the same vertical column as the LED,
wherein the body defines the audio port at a position between the at least two LEDs for allowing audio waves to be outputted toward an audience.

20. The LED panel of claim 19, wherein the at least two LEDs are configured to have a centroid of brightness that is unshifted as compared to the other LEDs that are not offset horizontally.

21. The LED panel of claim 15, wherein the body defines a plurality of audio ports in a non-uniform pattern over an area of the LED panel.

22. The LED panel of claim 15, wherein the audio port is positioned between at least two columns of LEDs, the LED panel further comprising:
a mirror positioned between the audio port and a column of LEDs; and
a beam splitter positionable between the column of LEDs and an audience position in the theatre.

23. The LED panel of claim 22, wherein the mirror is included in a plurality of mirrors and the beam splitter is included in a plurality of beam splitters, the plurality of mirrors and the plurality of beam splitters being positioned in alternating vertical columns.

24. The LED panel of claim 22, wherein the beam splitter is configured to split light from an LED of the plurality of LEDs into a first beam of light in a first direction and a second beam of light in a second direction, wherein the mirror is configured to reflect the second beam of light to a path that is in the first direction, but that is offset to the first beam of light, to create a visual effect of appearing to be more sources of LED light than a number of LEDs of the plurality of LEDs in the LED panel.

25. An active display that is positionable in a theatre, the active display comprising:
a plurality of active light elements that form pixels for the active display, each active light element of the plurality of active light elements representing a pixel of a plurality of pixels for the active display;
a diffuser structure positionable between the plurality of active light elements and an audience position in the theatre; and
a mask on the diffuser structure positionable in a line-of-sight from the audience position, the mask including alternating areas of opaque and transparent areas positionable in a line-of-sight from the audience position, wherein the transparent areas include at least two transparent areas per active light element of the plurality of active light elements to allow light from the plurality of active light elements to be emitted toward the audience position and to create a visual effect of appearing to be more pixels than a number of the plurality of active light elements.

26. The active display of claim 25, wherein the plurality of active light elements include a plurality of LEDs.

27. The active display of claim 25, further comprising:
a body defining an audio port positioned between at least two active light elements of the plurality of active light elements, for allowing audio waves to be outputted toward the audience position.

28. The active display of claim 25, further comprising:
a lens array positionable between the plurality of active light elements and the mask.

29. The active display of claim 25, wherein at least some of the transparent areas have different shapes than the other transparent areas.

30. A method, comprising:
outputting light from a plurality of light-emitting elements of an active display in a theatre, each light-emitting element of the plurality of light-emitting elements representing a pixel of a plurality of pixels in the active display;
outputting light from the plurality of light-emitting elements toward the audience-viewing position through a mask that includes alternating opaque areas and transparent areas to create a visual effect of the active display appearing to have more pixels than a number of the plurality of light-emitting elements in the active display, the opaque areas and the transparent areas being positioned in a line-of-sight from the audience-viewing position.

31. The method of claim 30, wherein the mask comprises a diffuser mask.

32. The method of claim 31, wherein the diffuser mask includes, for each light-emitting element of the plurality of light-emitting elements, a plurality of opaque areas and a plurality of transparent areas, the diffuser mask defining gaps therethrough that are visually indistinguishable with other areas of the diffuser mask.

33. The method of claim 31, further comprising:
directing, by an optical element positioned between the plurality of light-emitting elements and the diffuser mask, more light from the plurality of light-emitting elements to the transparent areas than to the opaque areas.

34. The method of claim 31, further comprising:
allowing sound waves to pass through an audio port defined by a body of the active display, from behind the active display to a front of the display and toward an audience-viewing position, wherein the diffuser mask defines a second audio port substantially aligned with the audio port defined by the body for allowing sound waves from a common source to pass through the audio port and the second audio port, the audio port defined by the body having an area that is at least three times greater than the area of the second audio port.

35. The method of claim 30, further comprising:
polarizing light form a first subset of the plurality of light-emitting elements in a first orientation; and
polarizing light from a second subset of the plurality of light-emitting elements in a second orientation.

36. The method of claim 30, wherein the plurality of light-emitting elements include at least two LEDs, each LED of the at least two LEDs being offset horizontally with respect to other LEDs of the plurality of light-emitting elements in the same vertical column as the LED,
wherein a body defines an audio port at a position between the at least two LEDs for allowing audio waves to be outputted toward the audience-viewing position.

37. The method of claim 30, further comprising:
splitting, by a beam splitter, light from a light-emitting element of the plurality of light-emitting elements into a first beam of light in a first direction and a second beam of light in a second direction; and
reflecting, by a mirror, the second beam of light to a path that is in the first direction, but that is offset to the first beam of light, to create a visual effect of the active display appearing to have more sources of light than a number of light-emitting elements of the plurality of light-emitting elements.

38. The method of claim 30, further comprising:
focusing light emitted by the plurality of light-emitting elements toward transmissive portions of a diffuser structure of the active display that is positioned between the plurality of light-emitting elements and the audience-viewing position in the theatre such that other portions of the diffuser structure remain dark.

39. A method comprising:
outputting light from a plurality of active light elements that form a plurality of pixels for an active display in a theatre, each active light element of the plurality of active light elements representing a pixel of the plurality of pixels; and
allowing the light to be emitted toward an audience position in the theatre through at least two transparent areas positionable in a line-of-sight from the audience position, of an otherwise opaque mask on a diffuser structure, per pixel of the plurality of pixels formed by the plurality of active light elements, the transparent areas being configured to allow light from the plurality of active light elements to pass through the mask to cause the active display to appear to have more pixels than a number of active light elements of the plurality of active light elements.

40. The method of claim 39, further comprising:
allowing audio waves to be outputted toward the audience position through an audio port defined by a body of the active display and positioned between at least two active light elements of the plurality of active light elements.

41. The method of claim 39, wherein the plurality of active light elements include a plurality of LEDs.

42. The method of claim 39, wherein the active display includes a lens array positioned between the plurality of active light elements and the mask.

43. The method of claim 39, wherein at least some of the transparent areas have different shapes than the other transparent areas.

* * * * *